(12) United States Patent
Xie et al.

(10) Patent No.: US 9,947,793 B1
(45) Date of Patent: Apr. 17, 2018

(54) VERTICAL PILLAR-TYPE FIELD EFFECT TRANSISTOR AND METHOD

(71) Applicant: GLOBALFOUNDRIES INC., Grand Cayman (KY)

(72) Inventors: Ruilong Xie, Schenectady, NY (US); Kangguo Cheng, Schenectady, NY (US); Tenko Yamashita, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/427,594

(22) Filed: Feb. 8, 2017

(51) Int. Cl.
| | |
|---|---|
| *H01L 29/78* | (2006.01) |
| *H01L 29/66* | (2006.01) |
| *H01L 27/088* | (2006.01) |
| *H01L 21/8234* | (2006.01) |
| *H01L 23/535* | (2006.01) |
| *H01L 21/768* | (2006.01) |
| *H01L 29/417* | (2006.01) |
| *H01L 21/311* | (2006.01) |

(52) U.S. Cl.
CPC ...... *H01L 29/785* (2013.01); *H01L 21/31111* (2013.01); *H01L 21/76895* (2013.01); *H01L 21/823418* (2013.01); *H01L 21/823431* (2013.01); *H01L 21/823475* (2013.01); *H01L 23/535* (2013.01); *H01L 27/0886* (2013.01); *H01L 29/41791* (2013.01); *H01L 29/66553* (2013.01); *H01L 29/66795* (2013.01)

(58) Field of Classification Search
CPC ......... H01L 21/31111; H01L 21/76895; H01L 21/823413; H01L 21/823418; H01L 21/823475; H01L 27/0886; H01L 29/41791; H01L 29/66553; H01L 29/66795; H01L 29/785
See application file for complete search history.

(56) References Cited

U.S. PATENT DOCUMENTS

| | | |
|---|---|---|
| 5,504,359 A | 4/1996 | Rodder |
| 5,637,898 A | 6/1997 | Baliga |
| 7,241,655 B2 * | 7/2007 | Tang ................. H01L 27/10876 257/E21.411 |
| 7,446,025 B2 | 11/2008 | Cohen et al. |
| 8,173,551 B2 | 5/2012 | Bai et al. |
| 9,349,594 B1 | 5/2016 | Cheng et al. |

(Continued)

*Primary Examiner* — Allan R Wilson
(74) *Attorney, Agent, or Firm* — Gibb & Riley, LLC; Yuanmin Cai, Esq.

(57) ABSTRACT

Disclosed is a method of forming a vertical pillar-type field effect transistor (FET). One or more semiconductor pillars are formed by epitaxial deposition in one or more openings, respectively, that extend through a first dielectric layer and that have high aspect ratios in two directions. The first dielectric layer is etched back and the following components are formed laterally surrounding the semiconductor pillar(s): a first source/drain region above and adjacent to the first dielectric layer, a second dielectric layer on the first source/drain region, a gate on the second dielectric layer and a gate cap on the gate. The gate cap extends over the top surface(s) of the semiconductor pillar(s). A recess is formed in the gate cap to expose at least the top surface(s) of the semiconductor pillar(s) and a second source/drain region is formed within the recess. Also disclosed is the vertical pillar-type FET structure.

14 Claims, 23 Drawing Sheets

(56) References Cited

U.S. PATENT DOCUMENTS

| | | |
|---|---|---|
| 9,520,494 B2 | 12/2016 | Jan et al. |
| 2005/0230716 A1* | 10/2005 | Moriya ................. H01L 27/088 |
| | | 257/288 |
| 2006/0046391 A1* | 3/2006 | Tang ................. H01L 27/10876 |
| | | 438/268 |
| 2012/0149202 A1* | 6/2012 | Pyo .................... H01L 21/0337 |
| | | 438/696 |
| 2014/0070326 A1* | 3/2014 | Masuoka .............. H01L 29/775 |
| | | 257/368 |
| 2015/0364381 A1* | 12/2015 | Choi ................. H01L 21/82348 |
| | | 438/268 |

\* cited by examiner

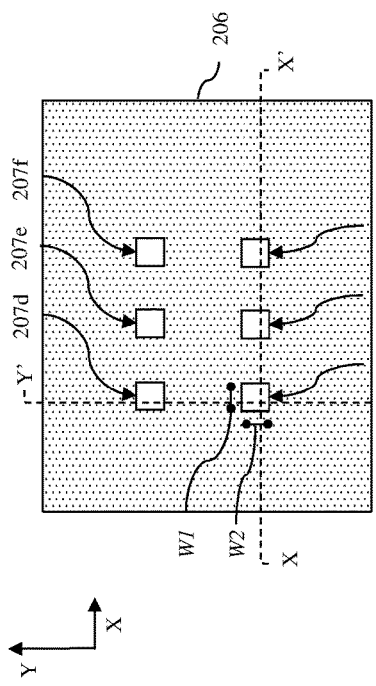
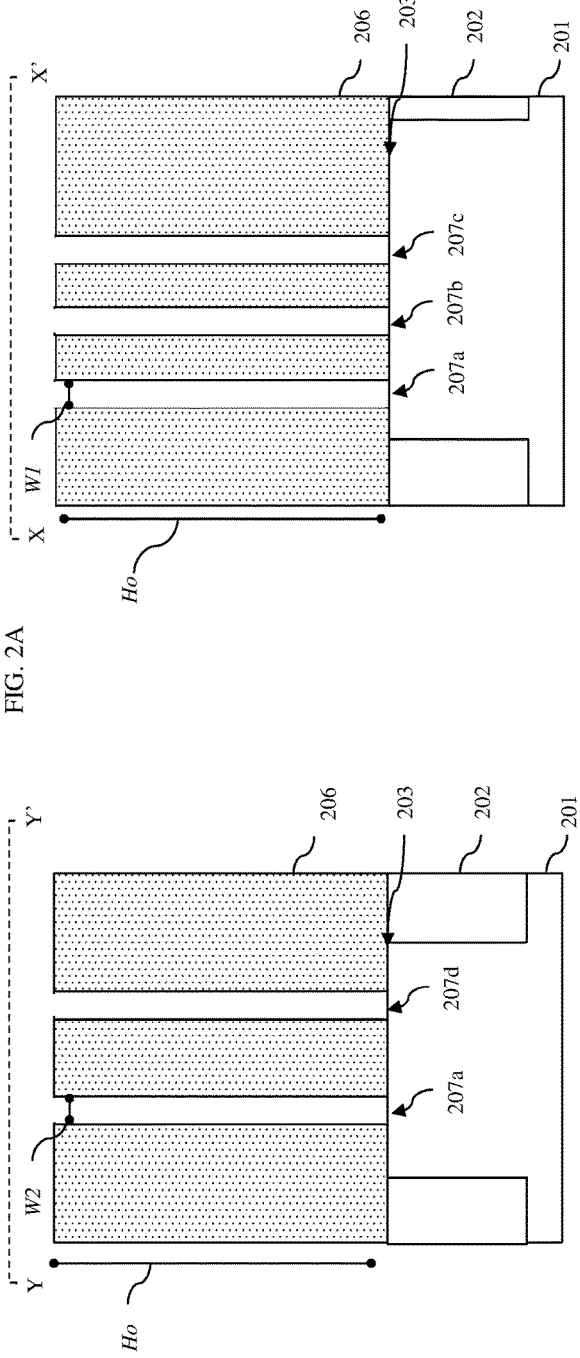
FIG. 2A
FIG. 2B
FIG. 2C

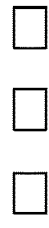
FIG. 3C
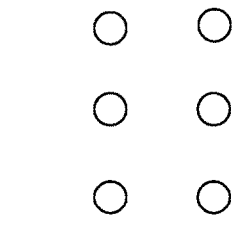
FIG. 3F
FIG. 3I
FIG. 3B
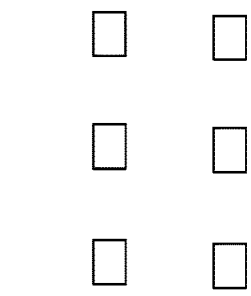
FIG. 3E
FIG. 3H
FIG. 3A
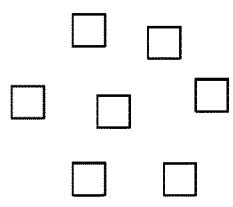
FIG. 3D
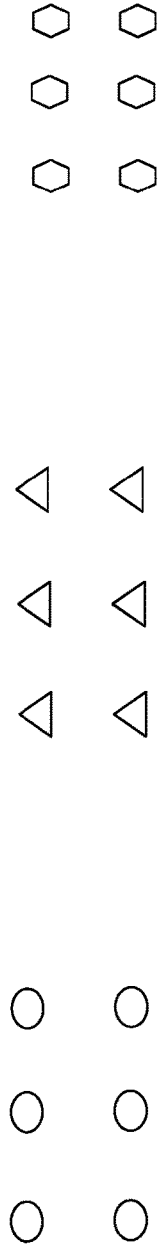
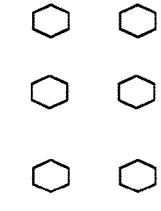
FIG. 3G

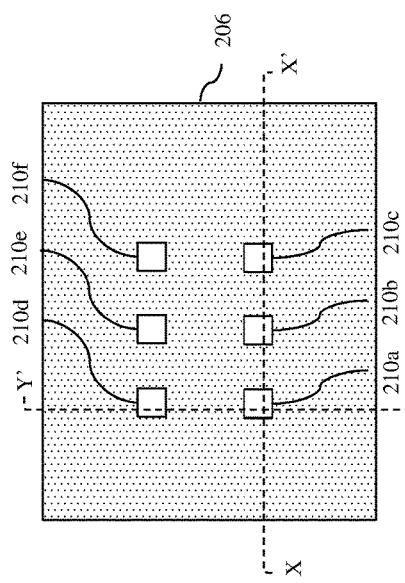
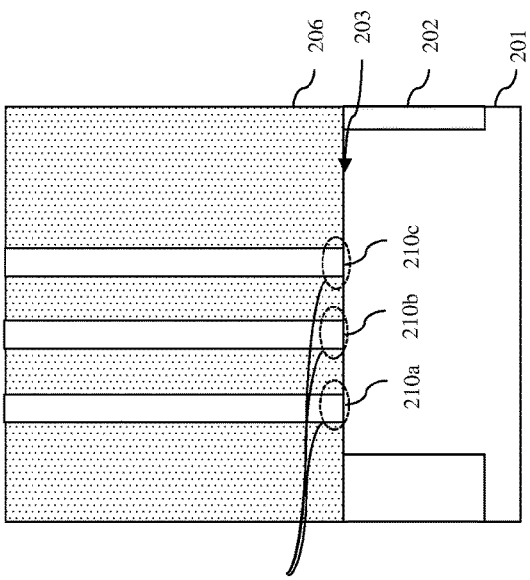
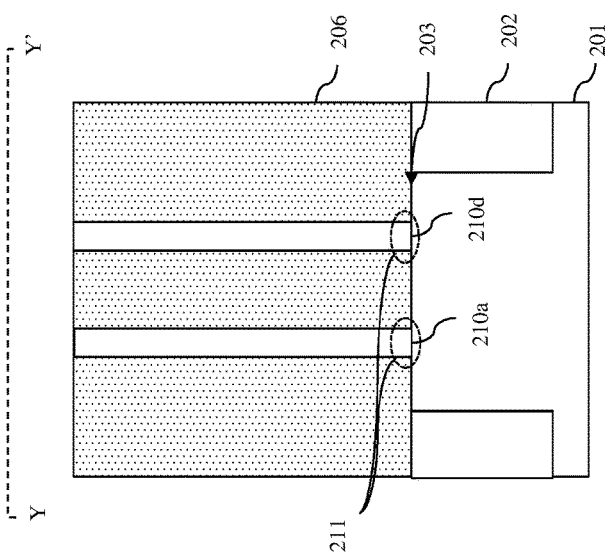
FIG. 4A
FIG. 4B
FIG. 4C

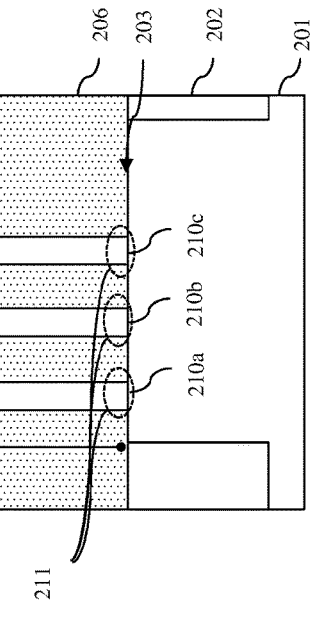
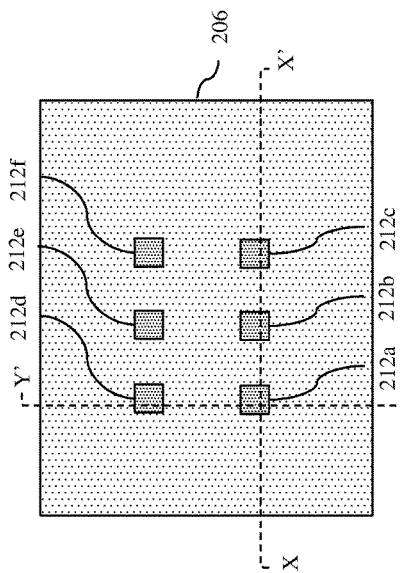
FIG. 5A
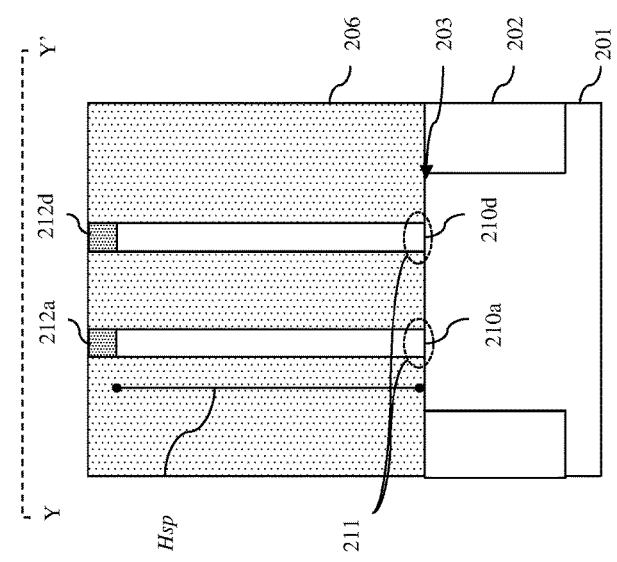
FIG. 5B
FIG. 5C

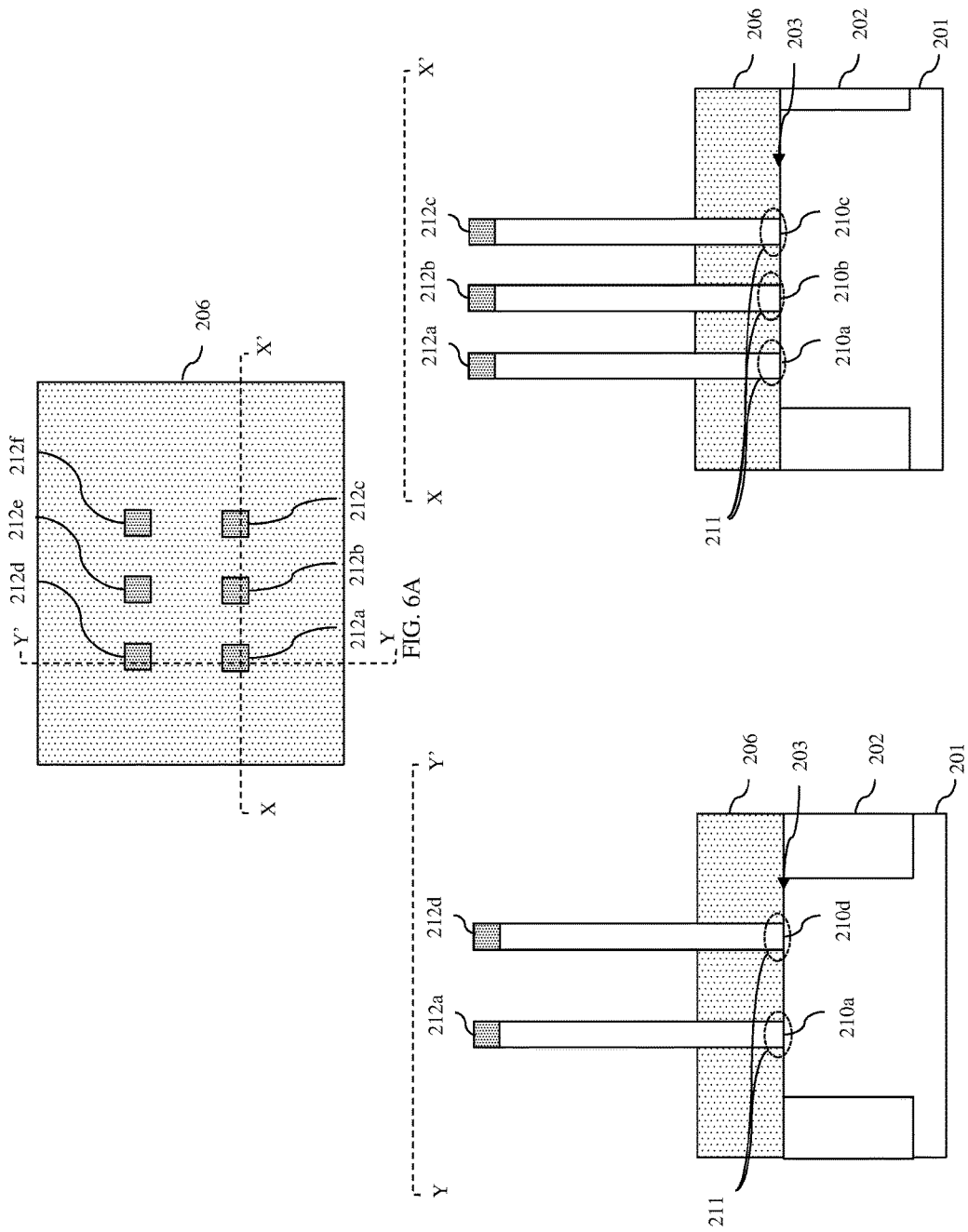

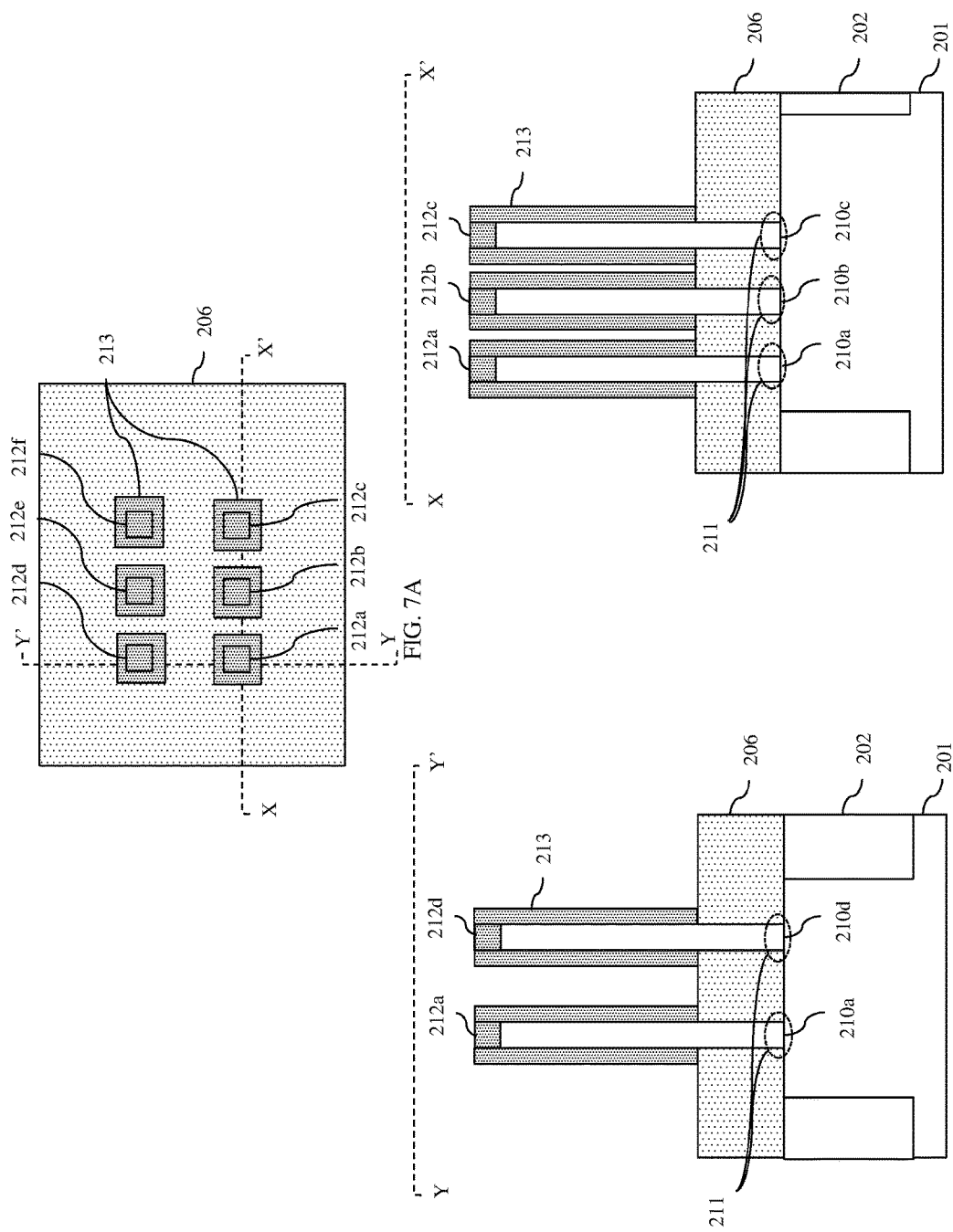

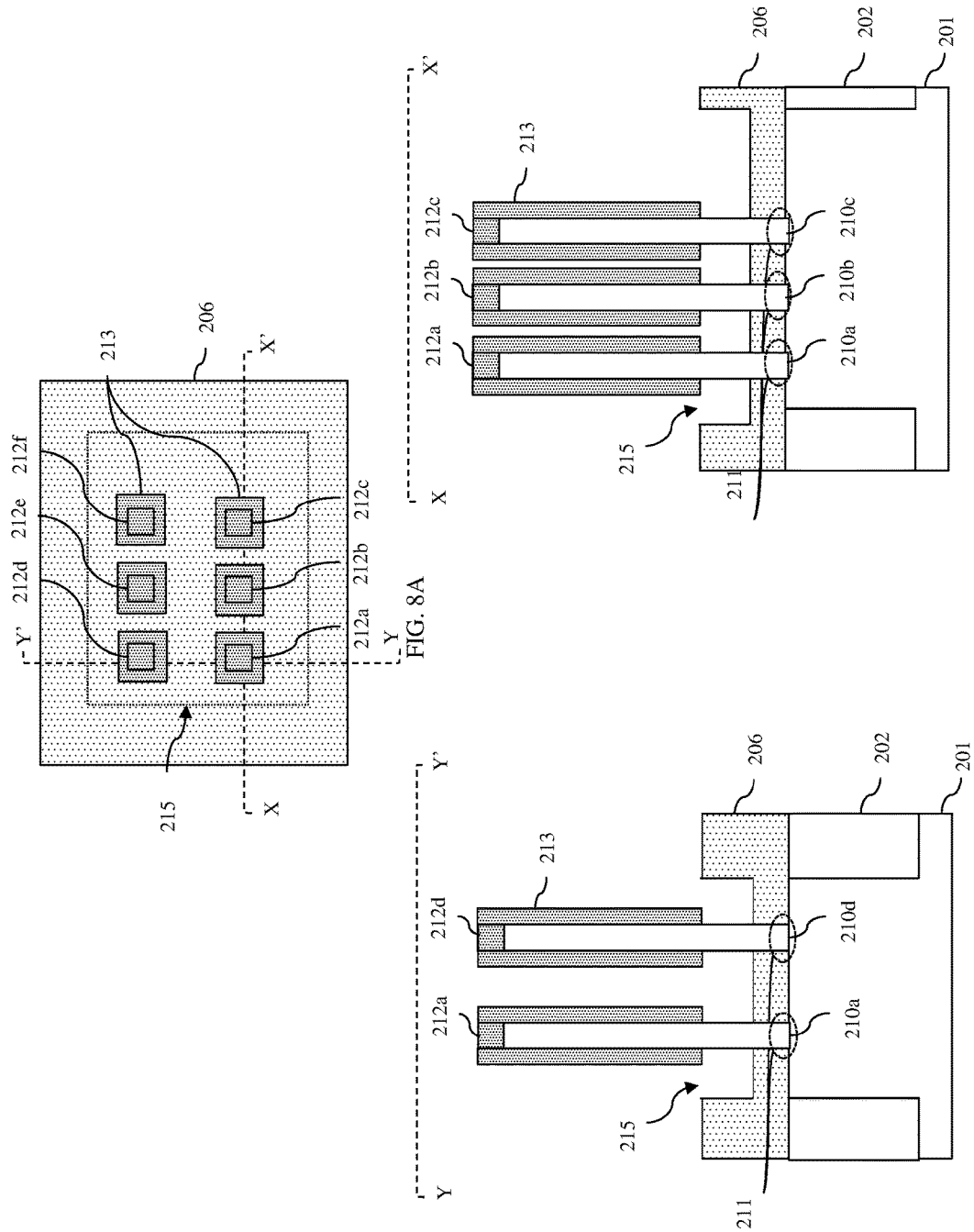

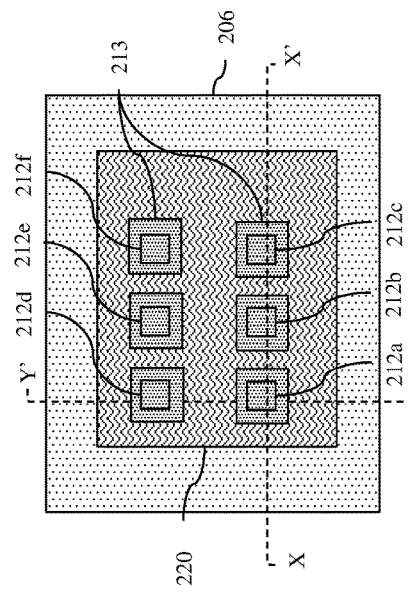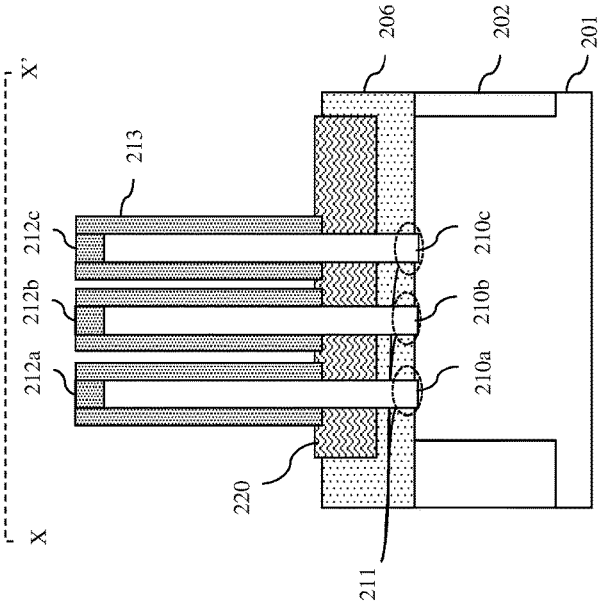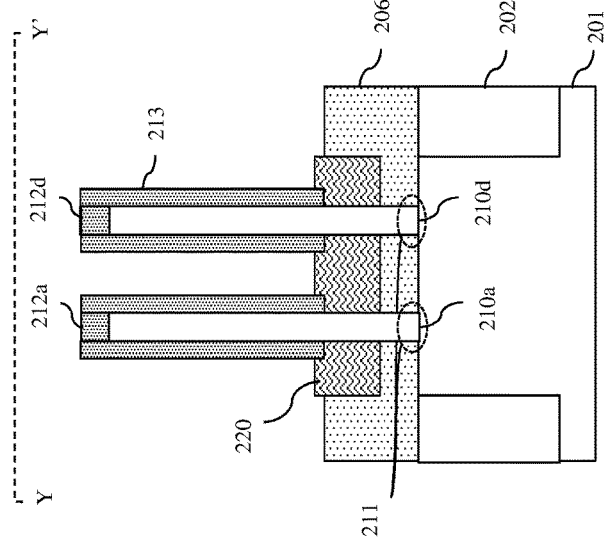

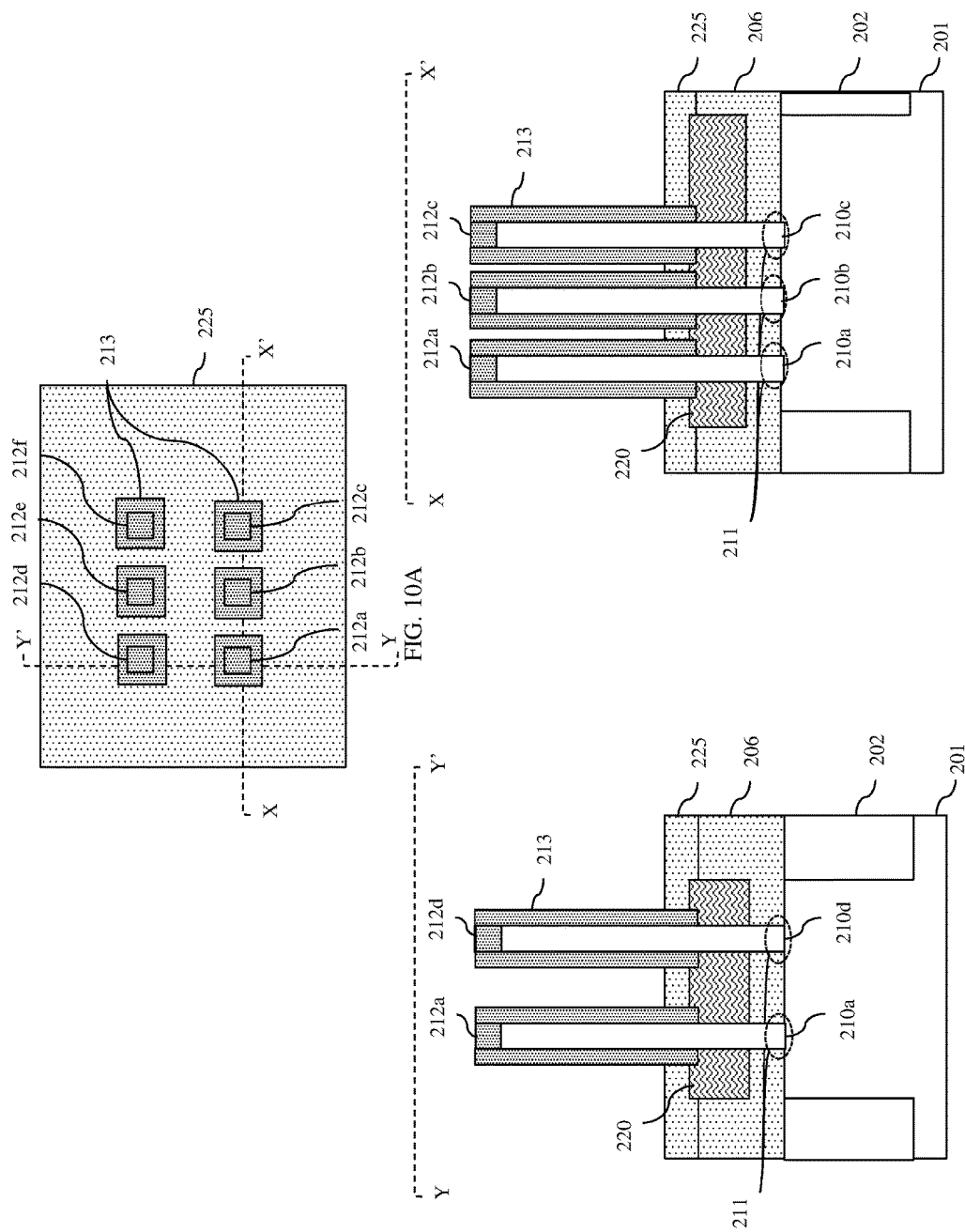

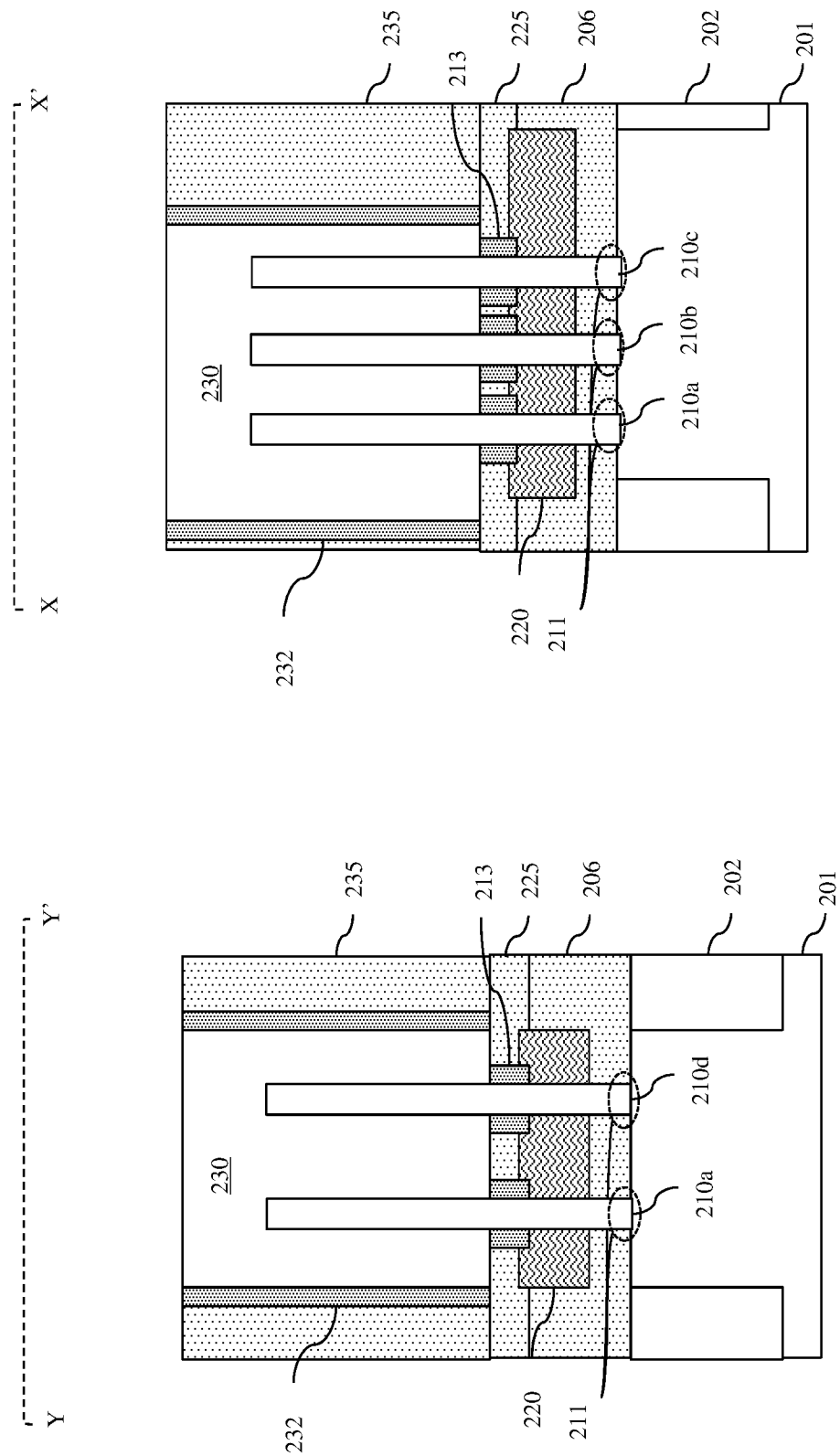

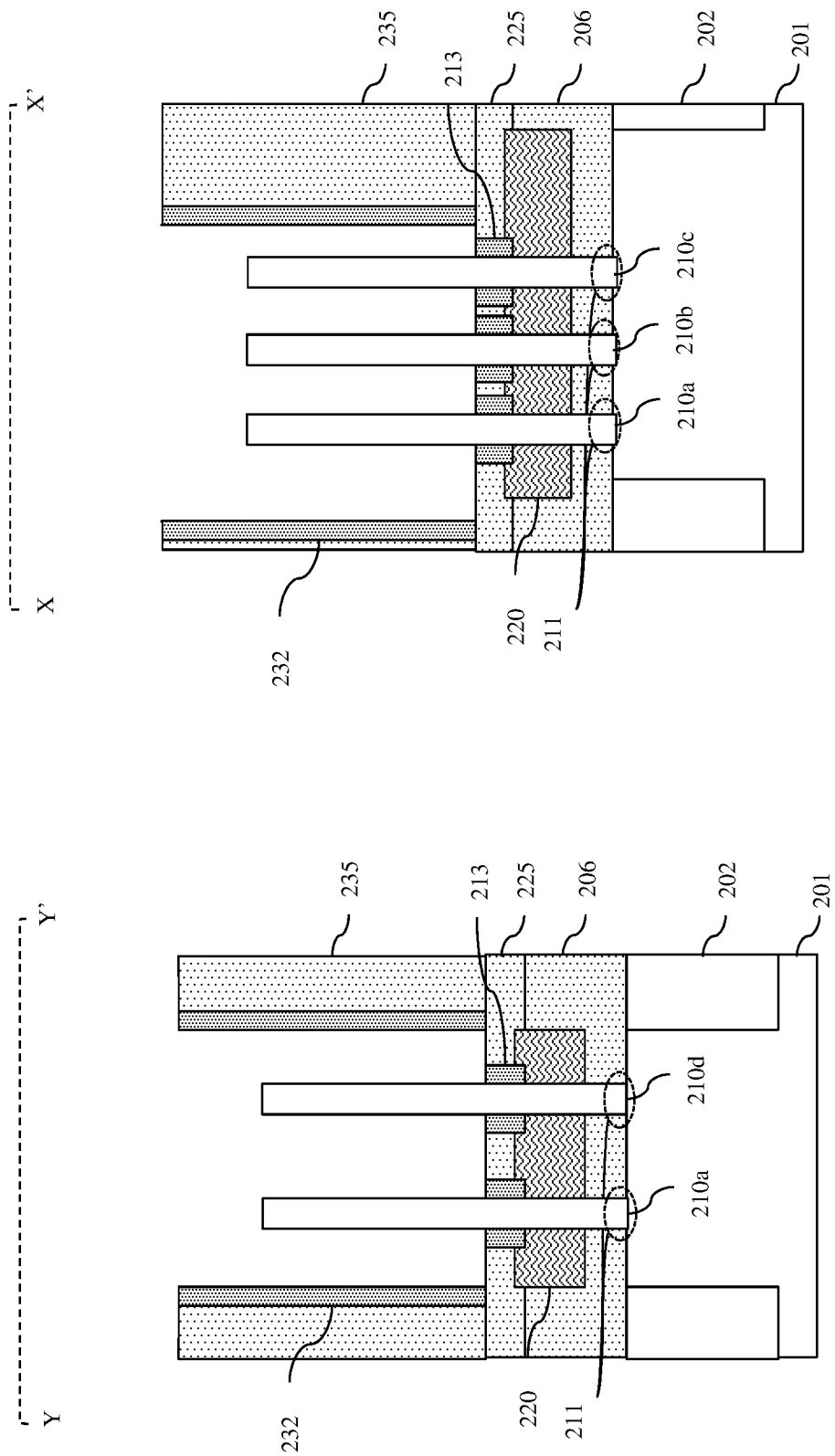

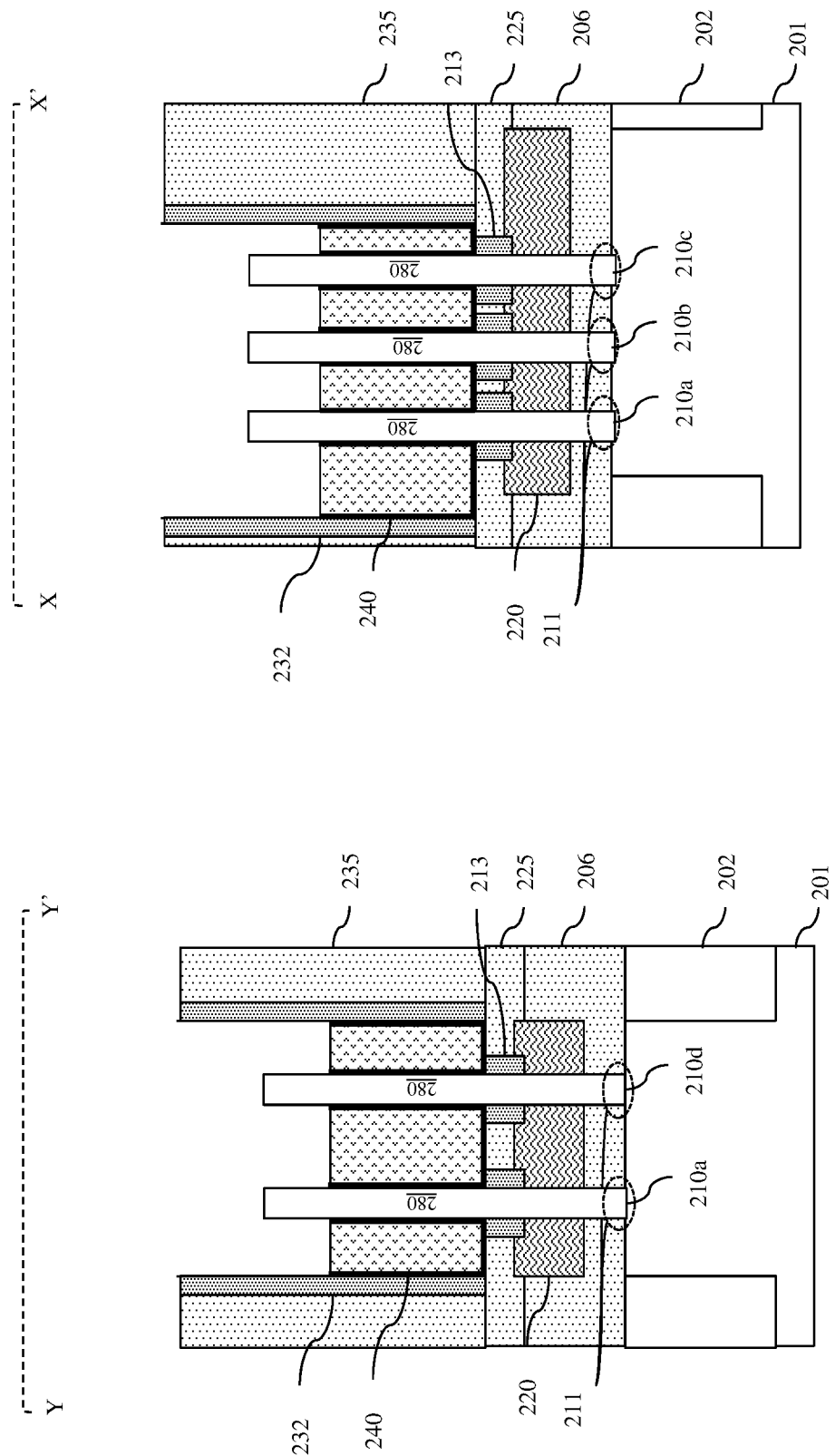

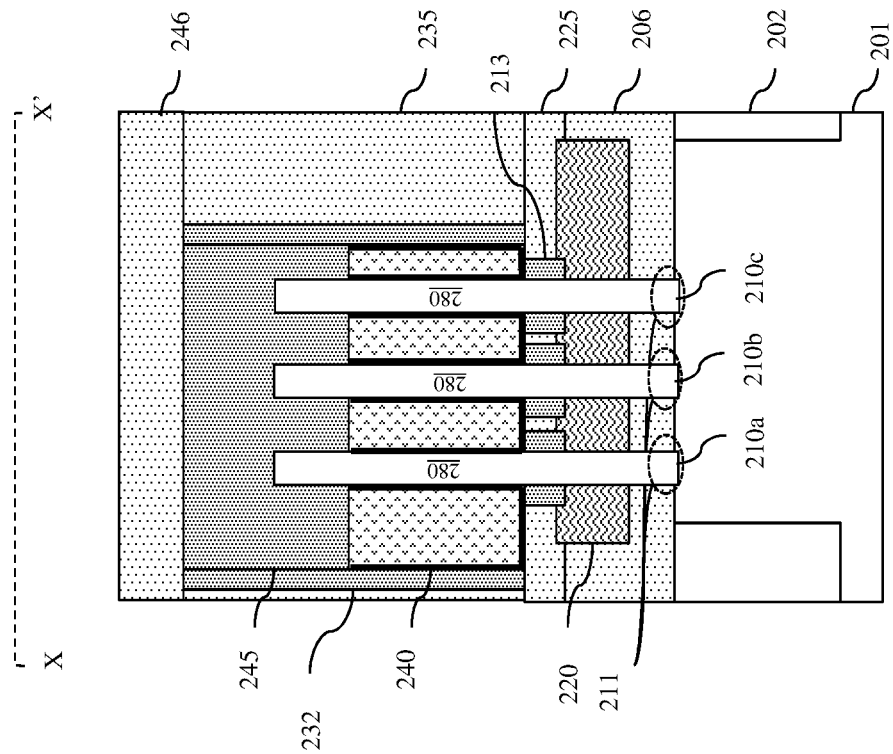
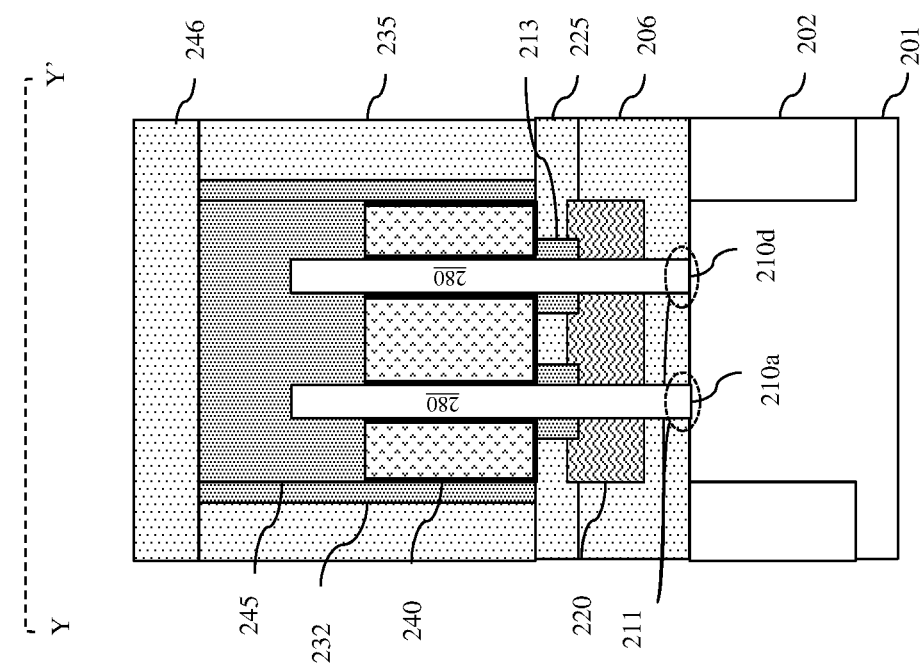
FIG. 16B
FIG. 16A

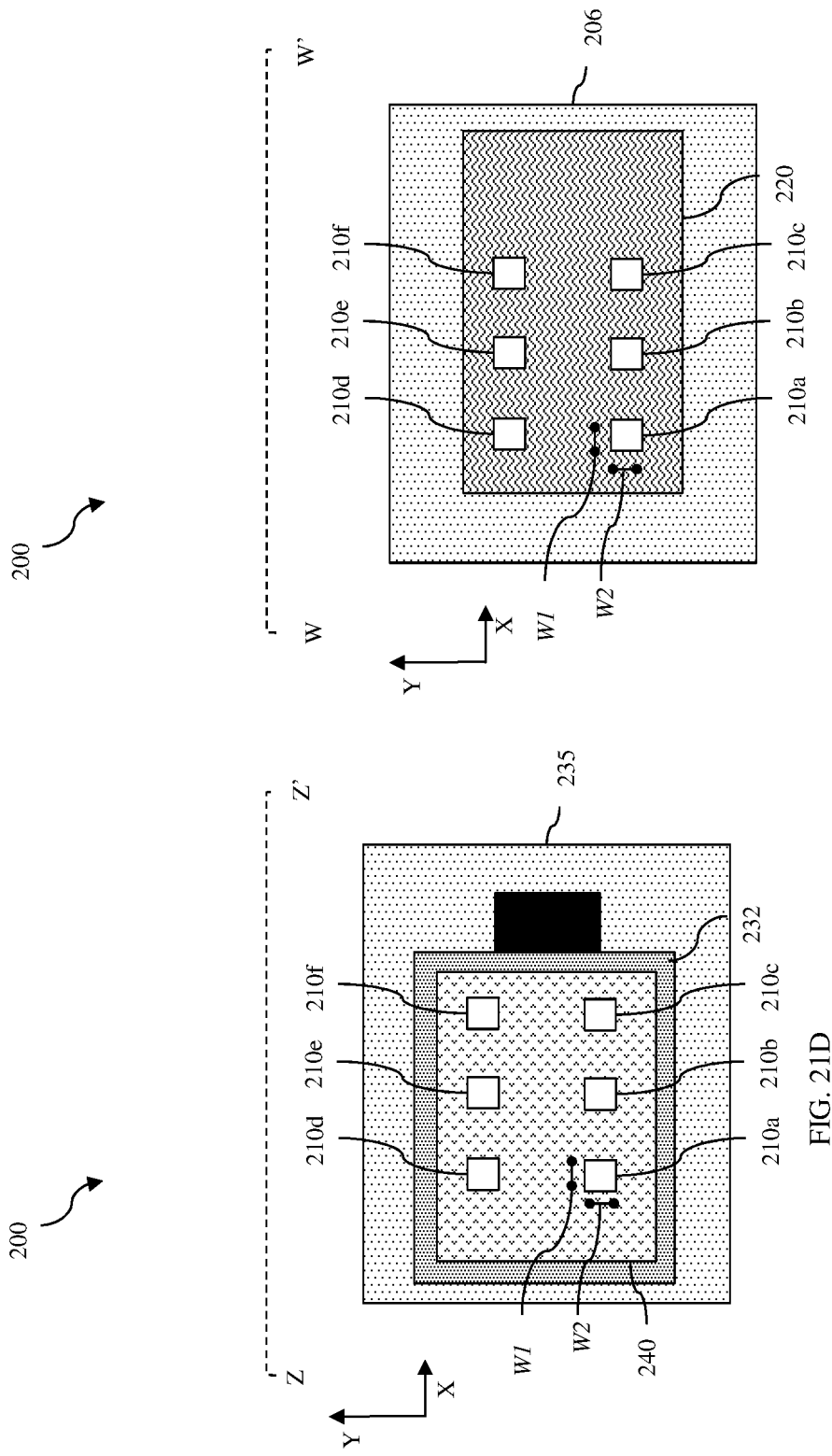

VERTICAL PILLAR-TYPE FIELD EFFECT TRANSISTOR AND METHOD

FIELD OF THE INVENTION

The present invention relates to field effect transistors (FETs) and, more particularly, to a method of forming a non-planar field effect transistor (FET) and the resulting FET structure.

BACKGROUND

More specifically, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits increased drive current. It should be noted that, because the semiconductor fin is so thin, any field effects exhibited at the top surface are insignificant (i.e., negligible). To further increase drive current, multiple parallel semiconductor fins can be incorporated into a single FINFET.

As device size scaling continues, designers have achieved optimal FINFET performance with semiconductor fins and, particularly, channel regions made of materials other than silicon. For example, III-V compound semiconductor materials (e.g., indium phosphide (InP), gallium arsenide (GaAs), etc.) are optimal for N-type FET (NFET) performance and germanium and silicon germanium with a high germanium percentage are optimal for P-type FET (PFET) performance. However, the use of silicon substrates is still desirable in terms of manufacturing efficiency and cost. Therefore, techniques have been developed for forming silicon semiconductor fins on a silicon substrate, covering the silicon fins with a dielectric layer, performing a polishing process (e.g., a chemical mechanical polishing (CMP) process) to expose the tops of the silicon fins, selectively removing the silicon fins and then performing an expitaxial growth process in order to replace the silicon fins with monocrystalline semiconductor fins made of some other semiconductor material. Unfortunately, due to lattice mismatch between the silicon substrate that acts as the seed layer and the epitaxial semiconductor material of the replacement semiconductor fins, defects can occur and can propagate throughout the replacement semiconductor fins so as to negatively impact device performance.

SUMMARY

Generally, disclosed herein are embodiments of a method of forming a non-planar field effect transistor (FET) and, particularly, a vertical pillar-type FET structure. In the method, one or more semiconductor pillars can be formed (e.g., by epitaxial deposition) in one or more openings, respectively, that extend vertically through a first dielectric layer and that have high aspect ratios (i.e., high height to width ratios) in two directions. The first dielectric layer can be etched back and the following components can be formed above the first dielectric layer and laterally surrounding the semiconductor pillar(s): a first source/drain region above and immediately adjacent to the first dielectric layer, a second dielectric layer on the first source/drain region, a gate on the second dielectric layer and a gate cap on the gate. The gate cap can extend over the top surface(s) of the semiconductor pillar(s), a recess can be formed in the gate cap to expose at least the top surface(s) of the semiconductor pillar(s) and a second source/drain region can be formed within the recess.

In one particular embodiment of this method, a first dielectric layer can be formed on a semiconductor substrate. Multiple openings can be formed such that each opening extends vertically through the first dielectric layer to the semiconductor substrate and such that each opening has high aspect ratios (i.e., high height to width ratios) in two directions. Next, semiconductor pillars can be formed (e.g., by epitaxial deposition) in the openings such that the semiconductor pillars have bottom surfaces immediately adjacent to the semiconductor substrate and top surfaces opposite the bottom surfaces.

Dielectric caps can be formed within the openings on the top surfaces of the semiconductor pillars. The first dielectric layer can subsequently be etched back without exposing the semiconductor substrate. After the first dielectric layer is etched back, dielectric spacers can be formed on the semiconductor pillars above the first dielectric layer.

Next, a first recess can be formed in the first dielectric layer below the dielectric spacers and around the semiconductor pillars. This first recess can specifically be formed such that lower portions of the semiconductor pillars remain laterally surrounded by the first dielectric layer and such that vertical surfaces of the semiconductor pillars between the first dielectric layer and the dielectric spacers are exposed. A first source/drain region can be formed (e.g., by epitaxial deposition) within the first recess on the first dielectric layer.

A second dielectric layer can be formed over the first source/drain region. This second dielectric layer can be relatively thin such that the semiconductor pillars and dielectric spacers thereon extend vertically above the level of the top surface of the second dielectric layer. The dielectric caps and any dielectric material of the dielectric spacers above the top surface of the second dielectric layer can then be selectively removed.

A gate can be formed above and immediately adjacent to the second dielectric layer such that the gate material laterally surrounds a designated channel region within each of the semiconductor pillars and further such that the gate has a gate sidewall spacer.

After the gate is formed, a gate cap can be formed on the top of the gate. The gate cap can specifically be formed such that it laterally surrounds end portions of the semiconductor pillars that extend above the top of the gate and such that it extends over the semiconductor pillars (i.e., such that it is above and immediately adjacent to the top surfaces of the semiconductor pillars).

A second recess can subsequently be formed in the gate cap to expose at least the top surfaces of the semiconductor pillars. This second recess can specifically be formed such that the bottom of the second recess is above and physically separated from the top of the gate. A second source/drain region can then be formed (e.g., by epitaxial deposition) within the second recess.

Also disclosed herein are embodiments of a non-planar field effect transistor (FET) structure and, particularly, a vertical pillar-type FET structure. The vertical pillar-type FET can include a substrate and at least one semiconductor pillar on the substrate. The semiconductor pillar can have a bottom surface immediately adjacent to the substrate and a top surface opposite the bottom surface. The semiconductor pillar can further have high aspect ratios (i.e., height to width ratios) in two directions.

The vertical pillar-type FET can further have a first dielectric layer above and immediately adjacent to the substrate and further laterally surrounding a lower portion of the semiconductor pillar.

The vertical pillar-type FET can further have the following components above the first dielectric layer and also laterally surrounding the semiconductor pillar: a first source/drain region above and immediately adjacent to the first dielectric layer, a second dielectric layer on the first source/drain region, a gate on the second dielectric layer and laterally surrounding a channel region within the semiconductor pillar, and a gate cap on the gate. The gate cap can extend over the top surface of the semiconductor pillar.

The vertical pillar-type FET can further can have a recess within the gate cap. This recess can expose at least the top surface of the semiconductor pillar. A second source/drain region can within the recess.

BRIEF DESCRIPTION OF THE SEVERAL VIEWS OF THE DRAWINGS

The present disclosure will be better understood from the following detailed description with reference to the drawings, which are not necessarily drawn to scale and in which:

FIG. 2A is a top view diagram and FIGS. 2B-2C are different cross-section diagrams illustrating a partially completed structure formed according to the flow diagram of FIG. 1;

FIGS. 3A-3I are drawings showing various different numbers, configurations and shapes for the opening(s) formed within the first dielectric layer and, thus, the semiconductor pillar(s) formed within the opening(s) at processes 104-106 of FIG. 1;

FIG. 3A is a top view diagram and FIGS. 3B-3C are different cross-section diagrams illustrating a partially completed structure formed according to the flow diagram of FIG. 1;

FIG. 4A is a top view diagram and FIGS. 4B-4C are different cross-section diagrams illustrating a partially completed structure formed according to the flow diagram of FIG. 1;

FIG. 5A is a top view diagram and FIGS. 5B-5C are different cross-section diagrams illustrating a partially completed structure formed according to the flow diagram of FIG. 1;

FIG. 6A is a top view diagram and FIGS. 6B-6C are different cross-section diagrams illustrating a partially completed structure formed according to the flow diagram of FIG. 1;

FIG. 7A is a top view diagram and FIGS. 7B-7C are different cross-section diagrams illustrating a partially completed structure formed according to the flow diagram of FIG. 1;

FIG. 8A is a top view diagram and FIGS. 8B-8C are different cross-section diagrams illustrating a partially completed structure formed according to the flow diagram of FIG. 1;

FIG. 9A is a top view diagram and FIGS. 9B-9C are different cross-section diagrams illustrating a partially completed structure formed according to the flow diagram of FIG. 1;

FIG. 10A is a top view diagram and FIGS. 10B-10C are different cross-section diagrams illustrating a partially completed structure formed according to the flow diagram of FIG. 1;

FIGS. 13A-13B are different cross-section diagrams illustrating a partially completed structure formed according to the flow diagram of FIG. 1;

FIGS. 14A-14B are different cross-section diagrams illustrating a partially completed structure formed according to the flow diagram of FIG. 1;

FIGS. 15A-15B are different cross-section diagrams illustrating a partially completed structure formed according to the flow diagram of FIG. 1;

FIGS. 16A-16B are different cross-section diagrams illustrating a partially completed structure formed according to the flow diagram of FIG. 1;

FIG. 21A is a top view diagram and FIGS. 21B-21E are different cross-section diagrams illustrating a vertical pillar-type field effect transistor formed according to the flow diagram of FIG. 1.

DETAILED DESCRIPTION

Figure 1:
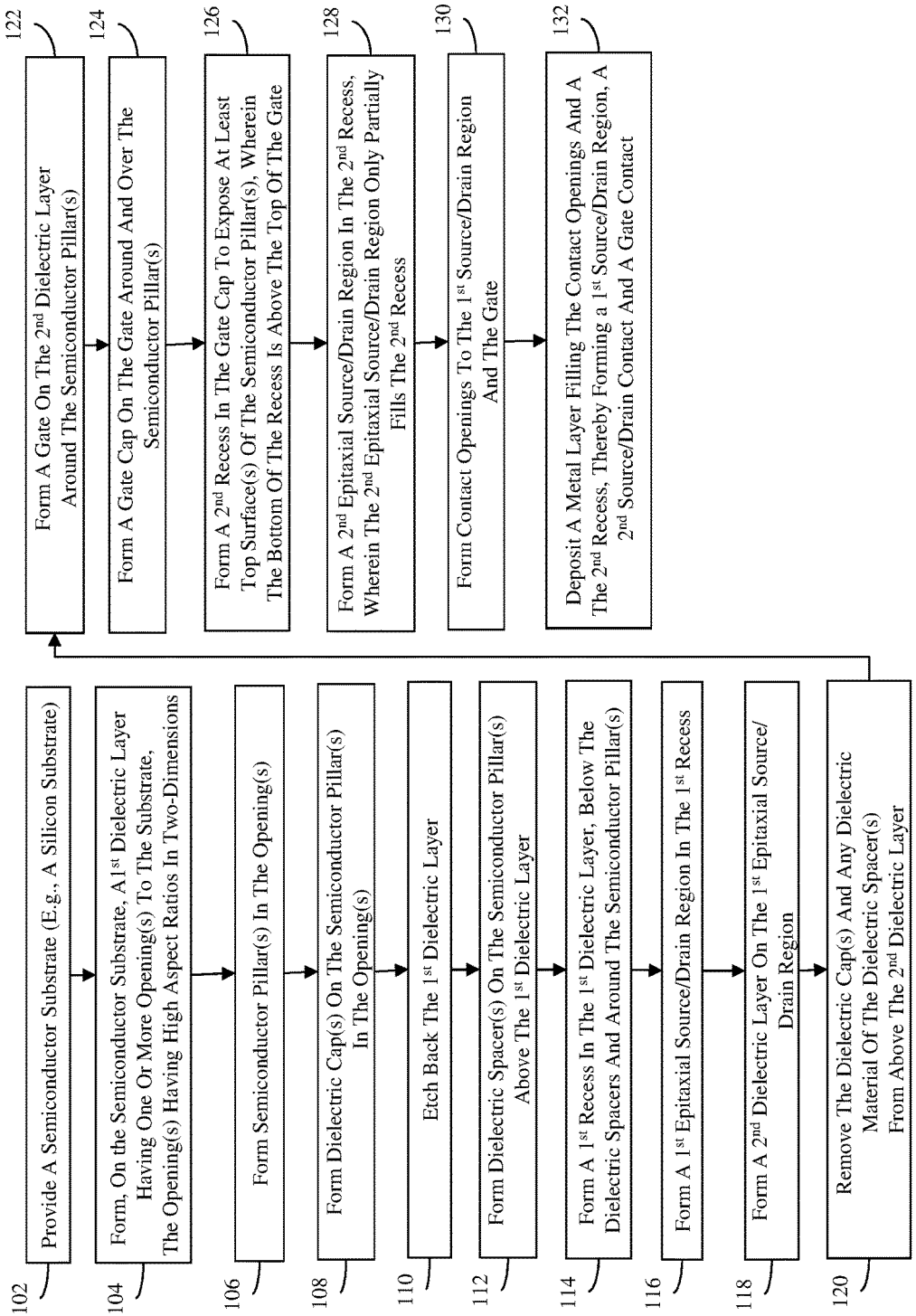
FIG. 1 is a flow diagram illustrating embodiments of a method of forming a vertical pillar-type field effect transistor (FET) structure.

As mentioned above, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits increased drive current. It should be noted that, because the semiconductor fin is so thin, any field effects exhibited at the top surface are insignificant (i.e., negligible). To further increase drive current, multiple parallel semiconductor fins can be incorporated into a single FINFET.

As device size scaling continues, designers have achieved optimal FINFET performance with semiconductor fins made of materials other than silicon. For example, III-V compound semiconductor materials (e.g., indium phosphide (InP), gallium arsenide (GaAs), etc.) are optimal for N-type FET (NFET) performance and germanium and silicon germanium with a high germanium percentage are optimal for P-type FET (PFET) performance. However, the use of silicon substrates is still desirable in terms of manufacturing efficiency and cost. Therefore, techniques have been developed for forming silicon semiconductor fins on a silicon substrate, covering the silicon fins with a dielectric layer, performing a polishing process (e.g., a chemical mechanical polishing (CMP) process) to expose the tops of the silicon fins, selectively removing the silicon fins and then performing an epitaxial growth process in order to replace the silicon fins with monocrystalline semiconductor fins made of some other semiconductor material. Unfortunately, due to lattice mismatch between the silicon substrate that acts as the seed layer and the epitaxial semiconductor material of the replacement semiconductor fins, defects can occur and can propagate throughout the replacement semiconductor fins so as to negatively impact performance.

One technique that has been used to minimize defects within replacement semiconductor fins is referred to as aspect ratio trapping (ART). In ART, each silicon fin is removed in a manner that forms, within the silicon substrate, a trench with angled sidewalls (e.g., a V-shaped trench). Epitaxial semiconductor material for a replacement semiconductor fin is then grown on the angle sidewalls. Any defects that develop near the silicon-epitaxial semiconductor material interface and that propagate in the fin width direction will be trapped within the trench as a result of the aspect ratio of the fin opening and, thereby the aspect ratio of the fin formed therein (i.e., as a result of the relatively narrow fin width as compared to the relatively tall fin height). However, any defects that develop near the silicon-epitaxial semiconductor material interface and that propagate in the fin length direction may still reach the upper portion or even the top of the replacement semiconductor fin.

In view of the foregoing, disclosed herein are embodiments of a method of forming a non-planar field effect transistor (FET) and, particularly, a vertical pillar-type FET structure. In the method, one or more semiconductor pillars can be formed by epitaxial deposition in one or more openings, respectively, that extend vertically through a first dielectric layer and that have high aspect ratios (i.e., height to width ratios) in two directions. The first dielectric layer can be etched back and the following components can be formed laterally surrounding the semiconductor pillar(s): a first source/drain region above and immediately adjacent to the first dielectric layer, a second dielectric layer on the first source/drain region, a gate on the second dielectric layer and a gate cap on the gate. The gate cap can extend over the top surface(s) of the semiconductor pillar(s), a recess can be formed in the gate cap to expose at least the top surface(s) of the semiconductor pillar(s) and a second source/drain region can be formed within the recess. Due to the bi-directional high aspect ratios of the openings and, more particularly, the semiconductor pillar(s) formed within the opening(s), any defects occurring during epitaxial deposition of a semiconductor pillar will be trapped below the level of the first source/drain region and, thus, will not negatively impact device performance. Also disclosed herein are embodiments of the resulting vertical pillar-type FET structure.

More particularly, referring to the flow diagram of FIG. 1, disclosed herein are embodiments of a method of forming a vertical pillar-type field effect transistor (FET) structure.

In the method, a substrate 201 can be provided (102, see FIGS. 2A-2C). This substrate 201 can be, for example, a bulk silicon substrate or any other suitable bulk monocrystalline semiconductor substrate. Alternatively, the substrate 201 can be some other monocrystalline semiconductor layer (e.g., a silicon layer of a silicon-on-insulator (SOI) wafer). In any case, the substrate 201 can be made of a first semiconductor material and can have at least a monocrystalline surface 203 suitable for use as a seed layer for subsequent epitaxial deposition of monocrystalline semiconductor material.

Shallow trench isolation (STI) regions 202 can be formed within the substrate 201 so as to define a device region (i.e., a region of the substrate 201 upon which at least one vertical pillar-type FET will be formed). Techniques for forming STI regions are well known in the art and, thus, the details of such techniques have been omitted from this specification.

The method can further include forming, on the substrate 201, a first dielectric layer 206 with one or more openings (e.g., see openings 207a-f) extending vertically there through to the substrate 201 (104). Specifically, the first dielectric layer 206 can be made of a first dielectric material. The first dielectric material can be, for example, silicon oxide or some other suitable dielectric material. The opening(s) 207a-f can be formed such that they extend vertically through the first dielectric layer 206 to the monocrystalline surface 203 of the substrate 201 and such that they each have high aspect ratios (i.e., height to width ratios) in two directions. That is, each opening will have the same height Ho, which is equal to the thickness of the first dielectric layer 206, a first width W1 in a first direction (e.g., the X-direction, as shown), and a second width W2 in a second direction (e.g., the Y-direction, as shown) that is essentially perpendicular to the first direction. Each opening can have a first aspect ratio in the first direction (defined as the ratio of the height Ho to the first width W1) and a second aspect ratio in the second direction (defined as the ratio of the height Ho to the second width W2) and both of these aspect ratios can be relatively high. For example, both the first aspect ratio and the second aspect ratio of each opening can be at least greater than 6 and preferably between 10 and 100. It should be noted that the first aspect ratio and the second aspect ratio of each opening could be approximately equal. Alternatively, the two aspect ratios of each opening can be different (as long as they both are high, as discussed above). In any case, the aspect ratios of the opening(s) formed in the first dielectric layer 206 at process 104 should be predetermined so that they are sufficiently high to provide for aspect ratio trapping (ART) in both directions, as discussed in greater detail below at process 106.

Referring to FIGS. 3A-3I, as mentioned above, the first dielectric layer 206 can be formed at process 104 so as to have a single opening (e.g., see FIG. 3A) or multiple openings (e.g., see FIG. 3B-3I). In the case of multiple openings, these openings can, for example, be arranged in a line (e.g., see FIG. 3B), arranged in a grid pattern of columns and rows (e.g., see FIG. 3C) or randomly arranged (e.g., see FIG. 3D). Additionally, the shape of the opening(s) as viewed in a cross-section parallel to the top surface of the first dielectric layer 206 can be any patternable shape, given the technique used to form the opening(s). For example, the shape of can be square (e.g., see FIG. 3-D), rectangular (e.g., see FIG. 3E), circular (e.g., see FIG. 3F), elliptical (e.g., see FIG. 3G), triangular (e.g., see FIG. 3H), or some other polygon shape (e.g., hexagonal, see FIG. 3I), etc. For purposes of illustration, the embodiments of the method are described in greater detail below and illustrated in the remaining figures with respect to the formation of multiple openings 207a-f arranged in a grid pattern and each having an essentially square shape. It should be understood that the Figures are not intended to be limiting and that any number of one or more openings of any patternable shape with high aspect ratios in both the X and Y directions could be formed at process 104.

It should be noted that any suitable technique for forming high aspect ratio openings in a dielectric layer could be used at process 104. For example, the openings 207a-f can simply be lithographically or otherwise patterned and etched into the first dielectric layer 206. Alternatively, in the case of a bulk semiconductor substrate, sacrificial semiconductor pillars can be lithographically or otherwise patterned and etched into an upper portion of the substrate 201 and the first dielectric layer 206 can be deposited over the sacrificial semiconductor pillars. The first dielectric layer 206 can then be polished (e.g., using a chemical mechanical polishing (CMP) process) to expose the top of each sacrificial semiconductor pillar and the sacrificial semiconductor pillars can be removed (e.g., using a selective etch process).

The phrase "selective etch process" refers to a process of selectively etching one material at a significantly faster rate than other materials. In this case, it refers to etching the sacrificial semiconductor pillars at a significantly faster rate than the first dielectric layer such that the sacrificial semiconductor pillars are removed without significantly impacting the height of the first dielectric layer 206. The selective etch process may stop at the first dielectric layer-substrate interface (as shown), slightly above the first dielectric layer-substrate interface such that a small segment of sacrificial pillar remains at the bottom of each opening (not shown), or slightly below the first dielectric layer-substrate interface such that a divot is formed in the surface 203 of the substrate 201 aligned below each opening (not shown).

In any case, after the openings 207a-f are formed in the first dielectric layer 206, semiconductor pillars 210a-f can be formed in the openings 207a-f such that each semiconductor pillar has a bottom surface immediately adjacent to the monocrystalline surface 203 of the substrate 201, a top surface opposite the bottom surface, and essentially the same high aspect ratios of the openings 207a-f, as discussed above (106, see FIGS. 4A-4C). The semiconductor pillars 210a-f can be formed, for example, by completely filling the openings 207a-f with a second semiconductor material using an epitaxial deposition process and the exposed monocrystalline surface 203 of the substrate 201 as a seed layer. As a result, the semiconductor pillars 210a-f will also be monocrystalline in structure. The second semiconductor material, which is epitaxially deposited to form the semiconductor pillars 210a-f in the openings 207a-f can be different from the first semiconductor material of the substrate 201. This second semiconductor material can be preselected for use in the FET channel region and, specifically, based upon the conductivity type of the FET being formed in order to achieve optimal performance. For example, for an N-type field effect transistor (NFET), the second semiconductor material can be a III-V compound semiconductor materials (e.g., indium phosphide (InP), gallium arsenide (GaAs), etc.); whereas, for a P-type FET (PFET), the second semiconductor material can be germanium or silicon germanium with a high germanium percentage. Additionally, for an NFET, the second semiconductor material can be in situ doped during the epitaxial deposition process so as to have a P-type conductivity at a relatively low conductivity level; whereas, for a PFET, the second semiconductor material can be in situ doped during the epitaxial deposition process so as to have an N-type conductivity at a relatively low conductivity level. Alternatively, for either an NFET or a PFET, the second semiconductor material could remain undoped. It should be noted that, due to lattice mismatch, between the first semiconductor material and the second semiconductor material defects may occur within the semiconductor pillars 210a-f near the substrate-semiconductor pillar interface. However, due to the bi-directional high aspect ratios of the openings and, more particularly, due to the bi-directional high aspect ratios of the semiconductor pillars 210a-f formed within those openings, such defects will be trapped in the lower portions 211 of the semiconductor pillars 210a-f.

If, during epitaxial deposition, the second semiconductor material grows out the top of the openings 207a-f and onto the top surface of the first dielectric layer 206, a polishing process (e.g., a CMP process) can be performed to remove any second semiconductor material from above the top surface of the first dielectric layer 206. Then, dielectric caps 212a-f can be formed on each of the semiconductor pillars 210a-f within the openings 207a-f (108, see FIGS. 5A-5C). Specifically, a selective etch process can be performed to etch back the semiconductor pillars 210a-f. That is, the second semiconductor material of the semiconductor pillars 210a-f can be etched such that the height Hsp of the semiconductor pillars 210a-f is slightly reduced relative to the height Ho of the openings 207a-f (i.e., relative to the original height of the first dielectric layer 206). The etch depth can be less than ¹⁄₁₀ the height Ho of the openings 207a-f such that the semiconductor pillars 210a-f, like the openings 207a-f, continue to have high aspect ratios in two directions. That is, following this etch back process, the semiconductor pillars 210a-f will have a first aspect ratio in the first direction (defined as the ratio of the height Hsp to the first width W1) and a second aspect ratio in the second direction (defined as the ratio of the height Hsp to the second width W2) and both of these aspect ratios will still be relatively high (e.g., at least greater than 6 and preferably between 10 and 100). A second dielectric material can then be deposited and a polishing process (e.g., a CMP process) can be performed in order to remove the second dielectric material from above the top surface of the first dielectric layer 206, thereby forming the dielectric caps 212a-f on each of the semiconductor pillars 210a-f. The second dielectric material can be, for example, silicon nitride or some other suitable dielectric material that is different from the first dielectric material.

The first dielectric layer 206 can subsequently be etched back (e.g., using a selective etch process) (110, see FIGS. 6A-6C). That is, the first dielectric layer 206 can be etched at a significantly faster rate than the adjacent second dielectric material of the dielectric caps 212a-f and the second semiconductor material of the semiconductor pillars 210a-f such that the height of the first dielectric layer 206 is reduced without removing the dielectric caps 212a-f or significantly impacting the height Hsp or widths W1 and W2 of the semiconductor pillars 210a-f. It should be noted that the first dielectric layer 206 should be etched back but not completely removed from the surface 203 of the substrate 201. Specifically, the first dielectric layer 206 should be etched such that the surface 203 is not exposed and such that the height of the first dielectric layer 206 above the surface 203 of the substrate 201 remains at least equal to the sum of the height of the lower portions 211 of the semiconductor pillars 210a-f, which have trapped therein any defects created during epitaxial deposition, and the desired depth of a first source/drain region recess (as discussed in greater detail below at processes 114-116).

After the first dielectric layer 206 is etched back, dielectric spacers 213 can be formed on the semiconductor pillars 210a-c above the first dielectric layer 206 (112, see FIGS. 7A-7B). The dielectric spacers 213 can be made of the same second dielectric material as the dielectric caps 212a-f. As mentioned above, the second dielectric material can be silicon nitride or some other suitable dielectric material that is different from the first dielectric material.

To form the dielectric spacers 213, a spacer layer (e.g., a layer of the second dielectric material) can be conformally deposited (e.g., by chemical vapor deposition (CVD) or another suitable deposition method) over the semiconductor pillars 210a-f and onto exposed surfaces of the first dielectric layer 206 around each of the semiconductor pillars 210a-f. An anisotropic etch process can then be performed in order to remove horizontal portions of the spacer layer from above the dielectric caps 212a-f and from the top surface of the first dielectric layer 206, thereby forming the dielectric spacers 213. As illustrated, these dielectric spacers 213 cover and protect the sidewalls of the semiconductor pillars 210a-f.

A first recess 215 and, particularly, a first source/drain recess can then be formed in the first dielectric layer 206 below the dielectric spacers 213 and around the semiconductor pillars 210a-f (114, see FIGS. 8A-8C). To form the first recess 215 a patterned mask layer can be formed over the partially completed structure. This patterned mask layer can have an opening that exposes the device region (e.g., the same region defined by the STI 202). Then, a selective anisotropic etch process can performed to directionally etch the area of the first dielectric layer 206 exposed within the opening of the patterned mask layer to form the first recess 215 without exposing the top surface of the substrate 201, followed by a slight isotropic etch of the first dielectric layer to expose vertical surfaces of semiconductor pillars 210a-f between the bottom of the first recess 215 and the dielectric spacers 213. That is, this first recess 215 can etched such the lower portions 211 of the semiconductor pillars 210a-f remain laterally surrounded by the first dielectric layer 206 and such that vertical surfaces of the semiconductor pillars 210a-f are exposed between the first dielectric layer 206 at the bottom of the first recess 215 and the dielectric spacers 213 above the first recess 215.

Once the first recess 215 is formed, a first source/drain region 220 can be formed within the first recess 215 (114, see FIGS. 9A-9C). For example, a third semiconductor material can be epitaxially deposited into the first recess 215 so as to be immediately adjacent to exposed vertical surfaces of the semiconductor pillars 210a-f, thereby forming a first source/drain region 220 on the first dielectric layer 206 and above the level of the lower portions 211 of the semiconductor pillars 210a-f, which may contain any defects. The third semiconductor material can be epitaxially deposited so as to completely fill the first recess 215. Optionally, the third semiconductor material can be deposited so as to overfill the first recess 215 and then etched back so that the resulting first source/drain region 220 has a desired thickness, which is optionally greater than the depth of the first recess 215. As a result, the dielectric spacers 213 may extend partially into the first source/drain region 220. The third semiconductor material can be the same semiconductor material as the first semiconductor material of the substrate 201 (e.g., silicon), the same semiconductor material as the second semiconductor material of the semiconductor pillars 210a-f, or some other suitable semiconductor material depending upon the conductivity type of the FET being formed. It should be noted that in situ doping can be performed during the epitaxial deposition process so that the first source/drain region 220 has a desired conductivity type and level given the conductivity type of the FET being formed. For example, for an NFET, the third semiconductor material could be in situ doped during the epitaxial deposition process so that the first source/drain region 220 has an N-type conductivity at a relatively high conductivity level. For a PFET, the third semiconductor material can be in situ doped during the epitaxial deposition process so that the first source/drain region 220 has a P-type conductivity at a relatively high conductivity level.

A second dielectric layer 225 can then be formed over the first source/drain region 220, laterally surrounding the semiconductor pillars 210a-f and physically separated therefrom by the dielectric spacers 213 (118, see FIGS. 10A-10C). The second dielectric layer 225 can be made of the same first dielectric material as the first dielectric layer 206. For example, the second dielectric layer 225 can be made of silicon oxide or some other suitable dielectric material that is different from the second dielectric material of the dielectric caps 212a-f and dielectric spacers 213. The second dielectric layer 225 can be formed (e.g., deposited and etched back) such that it is a relatively thin layer and, specifically, such that the semiconductor pillars 210a-f and dielectric spacers thereon extend vertically above the level of the top surface of the second dielectric layer 225.

Figures 11A, 11B:
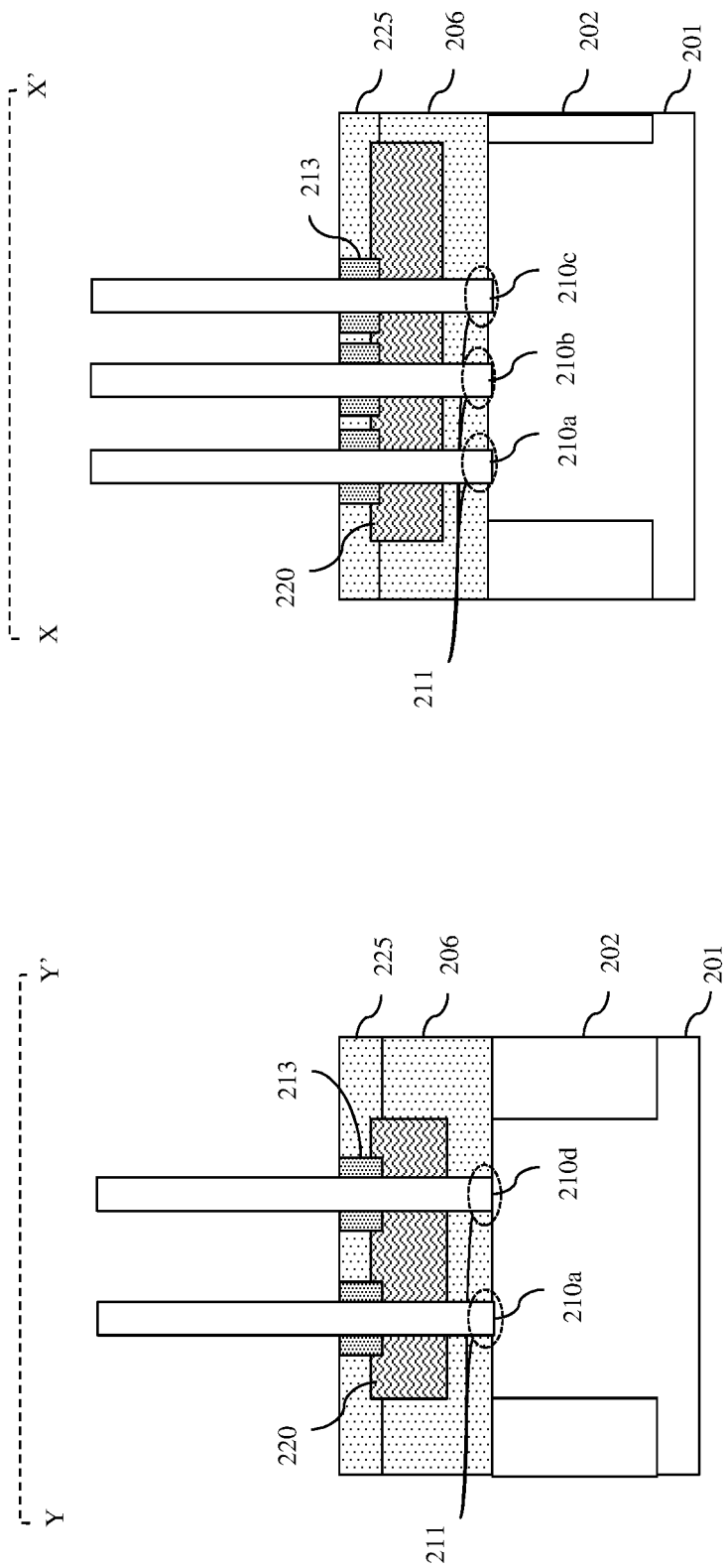
FIGS. 11A-11B are different cross-section diagrams illustrating a partially completed structure formed according to the flow diagram of FIG. 1.

Next, a selective etch process can be performed in order to selectively remove, from the semiconductor pillars 210a-f, the dielectric caps 212a-f and any of the second dielectric material of the dielectric spacers 213 above the level of the top surface of the second dielectric layer 225 (120, see FIGS. 11A-11C). Thus, following process 120, the upper portions of the semiconductor pillars 210a-f will be exposed.

A gate can be formed on the upper portions of the semiconductor pillars 210a-f above the second dielectric layer 225 (122). This gate can be formed such that it laterally surrounds each of the semiconductor pillars 210a-f and further such that it has a gate sidewall spacer. For example, the gate can be formed so as to have a gate dielectric layer immediately adjacent to and laterally surrounding vertical surfaces of the semiconductor pillars 210a-f at designated channel regions and a gate conductor layer on the gate dielectric layer such that the gate conductor layer also laterally surrounds the semiconductor pillars 210a-f and is physically separated therefrom by the gate dielectric layer (i.e., such that the gate dielectric layer is positioned laterally between the gate conductor layer and vertical surfaces of the semiconductor pillars at the channel regions, respectively).

The gate can be formed at process 122 according to a conventional gate-first gate formation technique (e.g., using a silicon oxide gate dielectric layer and a doped polysilicon gate conductor layer). Alternatively, the gate can be formed at process 122 using a replacement metal gate formation technique. For purposes of illustration, an exemplary replacement metal gate formation technique is described below and illustrated in the Figures.

Figure 12B:
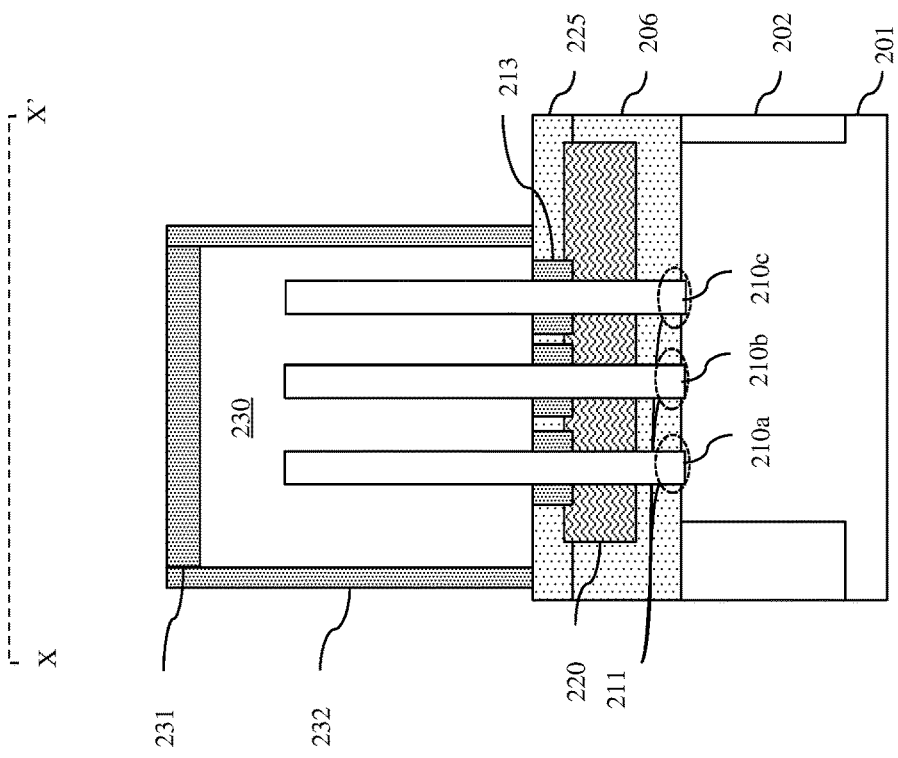
FIGS. 12A-12B are different cross-section diagrams illustrating a partially completed structure formed according to the flow diagram of FIG. 1.
Figure 12A:
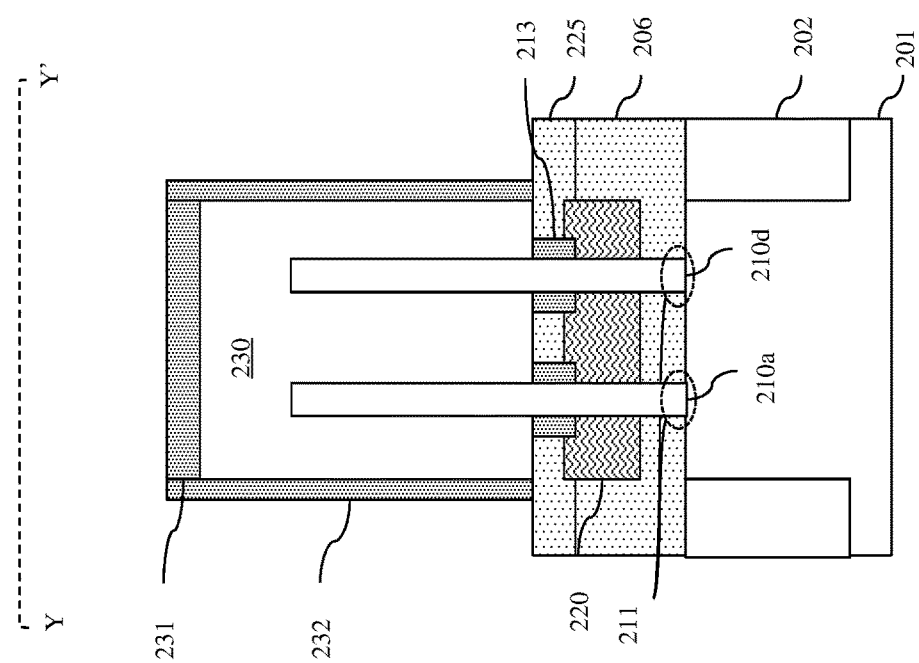

Specifically, a first sacrificial layer can be formed on the second dielectric layer 225 covering the upper portions of the semiconductor pillars 210a-f. The first sacrificial layer can include one or more layers. For example, the first sacrificial layer can include a thin dummy gate oxide and any of a blanket sacrificial polysilicon layer, a blanket sacrificial amorphous silicon layer or other suitable blanket sacrificial layer on the thin dummy oxide layer. A second sacrificial layer (e.g., a sacrificial nitride layer), which is different from the first sacrificial layer, can be formed on the top surface of the first sacrificial layer. The first and second sacrificial layers can then be lithographically patterned and etched to form a sacrificial gate 230 (also referred to herein as a dummy gate), having a sacrificial gate cap 231. Next, a gate sidewall spacer 232 can be formed on the sidewalls of the sacrificial gate 230 (see FIGS. 12A-12C). That is, a relatively thin conformal spacer layer (e.g., a silicon nitride layer) can be deposited over the partially completed structure. An anisotropic etch process can then be performed so as to remove the conformal spacer layer from horizontal surfaces of the gate and second dielectric layer 225, thereby forming the gate sidewall spacer 232.

Next, an interlayer dielectric (ILD) layer 235 can be formed over the partially completed structure and then polished (e.g., using a CMP process) (see FIGS. 6A-6C). Specifically, a blanket ILD layer 235, which is made of the same first dielectric material as the first and second dielectric layers or made of some other suitable ILD material, can be deposited. A polishing process (e.g., a CMP process) can then be performed in order to remove the sacrificial gate cap 231 and expose the top surface of the sacrificial gate 230 (e.g., see FIGS. 13A-13B).

The sacrificial gate 230 can then be selectively removed and replaced with a replacement metal gate 240 (see FIGS. 14A-14B and 15A-15B). For example, the sacrificial material of the sacrificial gate 230 can be selectively etched over the dielectric material used for the gate sidewall spacer 232 and the ILD layer 235 (see FIGS. 14A-14B). Removal of the sacrificial gate 230 will create a gate opening in the ILD layer 235. As illustrated, this gate opening exposes the upper portions of the semiconductor pillars 210a-f and has sidewalls that are lined with the gate sidewall spacer 232. A replacement metal gate 240 can then be formed in the gate opening (see FIGS. 15A-15B). For example, a conformal high-K gate dielectric layer can be deposited so as to line the gate opening and cover exposed surfaces of the semiconductor pillars 210a-f. One or more metal layers can be deposited onto the gate dielectric layer. Those skilled in the art will recognize that the materials of the dielectric and metal layers used for replacement metal gates can be preselected to achieve desired work functions given the conductivity type of the FET (see detail discussion below). In any case, a CMP process can be performed in order to remove all gate materials from above the top surface of the ILD layer 235. The materials of the replacement metal gate 240 can then be recessed such that the top of the replacement metal gate 240 is below the level of the top surface of the ILD layer 235, at or below ends of the semiconductor pillars 210a-f, and still laterally surrounding a channel region 280 within each semiconductor pillar 210a-f.

It should be noted that, regardless of whether a gate first or a replacement metal gate technique is used to form the gate 240, the gate structure should be patterned such that at least one outer edge portion of the first source/drain region 220 extends laterally beyond the gate 240. This outer edge portion of the first source/drain region 220 can subsequently be contacted at process 130-132, discussed in greater detail below.

After the gate 240 is formed, a gate cap 245 can be formed above and immediately adjacent to the gate 240 (124, see FIGS. 16A-16B). The gate cap 245 can specifically be formed such that it laterally surrounds any end portions of the semiconductor pillars 210a-f that extend above the level of the top of the gate 240 and also such that it extends over the semiconductor pillars 210a-f (i.e., such that it is above and immediately adjacent to the top surfaces of the semiconductor pillars 210a-f). The gate cap 245 can be made, for example, by depositing a gate cap layer so as to fill the gate cap opening and then performing a polishing process (e.g., a CMP process) to remove the gate cap layer from above the top surface of the ILD layer 235. The gate cap layer can be made of the same second dielectric material as used for the dielectric spacers 213 and gate sidewall spacer 232. Following formation of the gate cap 245, an additional ILD layer 246 can optionally be formed above and immediately adjacent to the gate cap 245 and ILD layer 235. The additional ILD layer 246 can be made of the same dielectric material as the ILD layer 235.

Figure 17B:
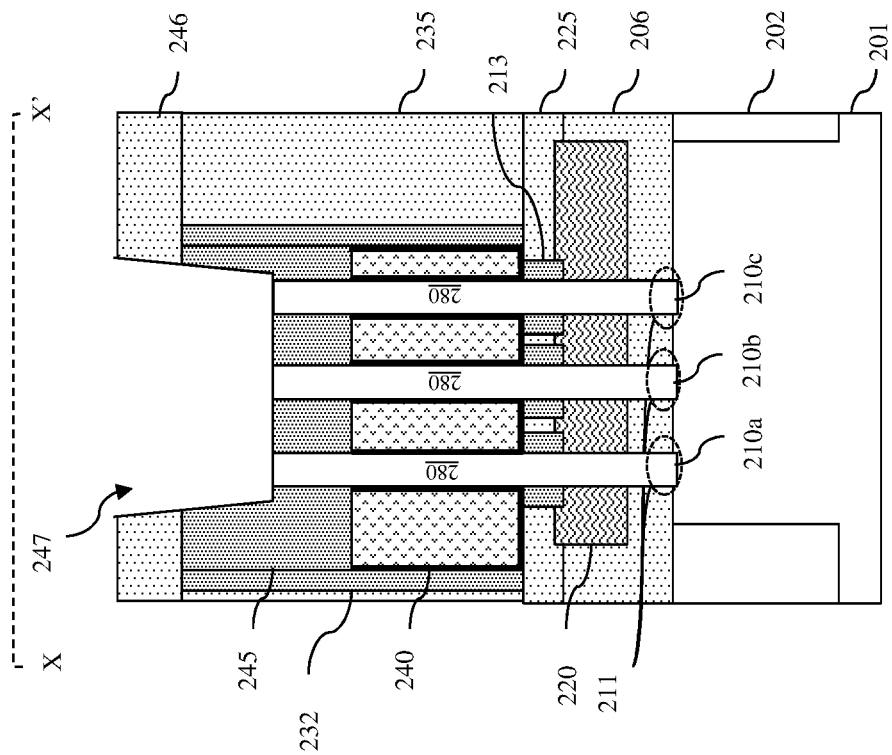
FIGS. 17A-17B are different cross-section diagrams illustrating a partially completed structure formed according to the flow diagram of FIG. 1.
Figure 17A:
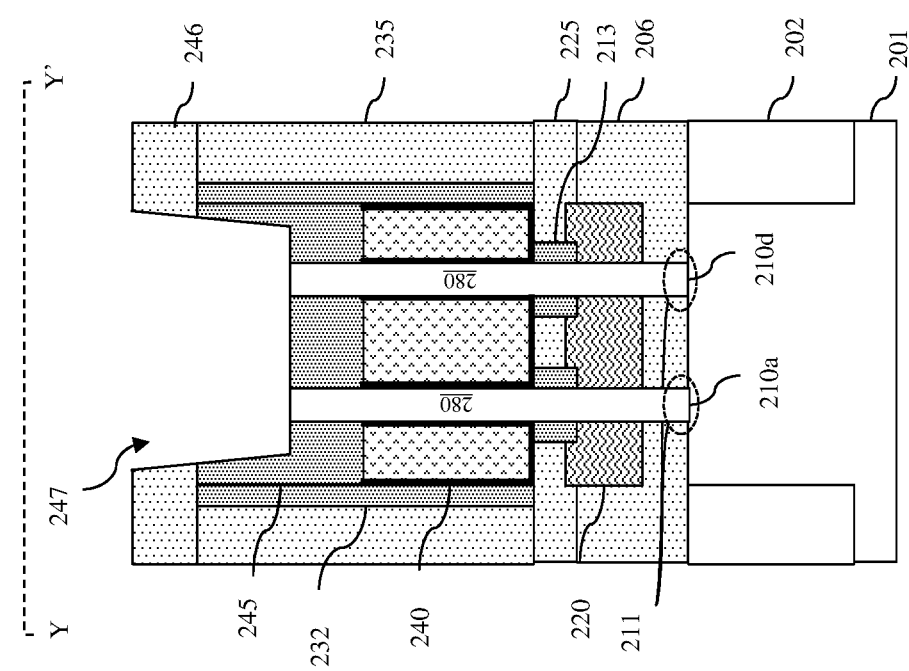

Next, a second recess 247 and, particularly, a second source/drain recess can be formed (e.g., lithographically patterned and etched) through the additional ILD layer 246 and into the gate cap 245 (126, see FIGS. 17A-17B). The second recess 247 can specifically be formed so as to expose at least the top surfaces of the semiconductor pillars 210a-f without exposing the top of the gate 240 (i.e., so that the bottom of the second recess 247 is above and physically separated from the top of the gate 240).

It should be noted that the second recess 247 should be patterned such that at least one outer edge portion of the gate 240 extends laterally beyond the second recess 247. This outer edge portion of the gate 240 can subsequently be contacted at process 130-132, discussed in greater detail below.

Figures 18A, 18B:
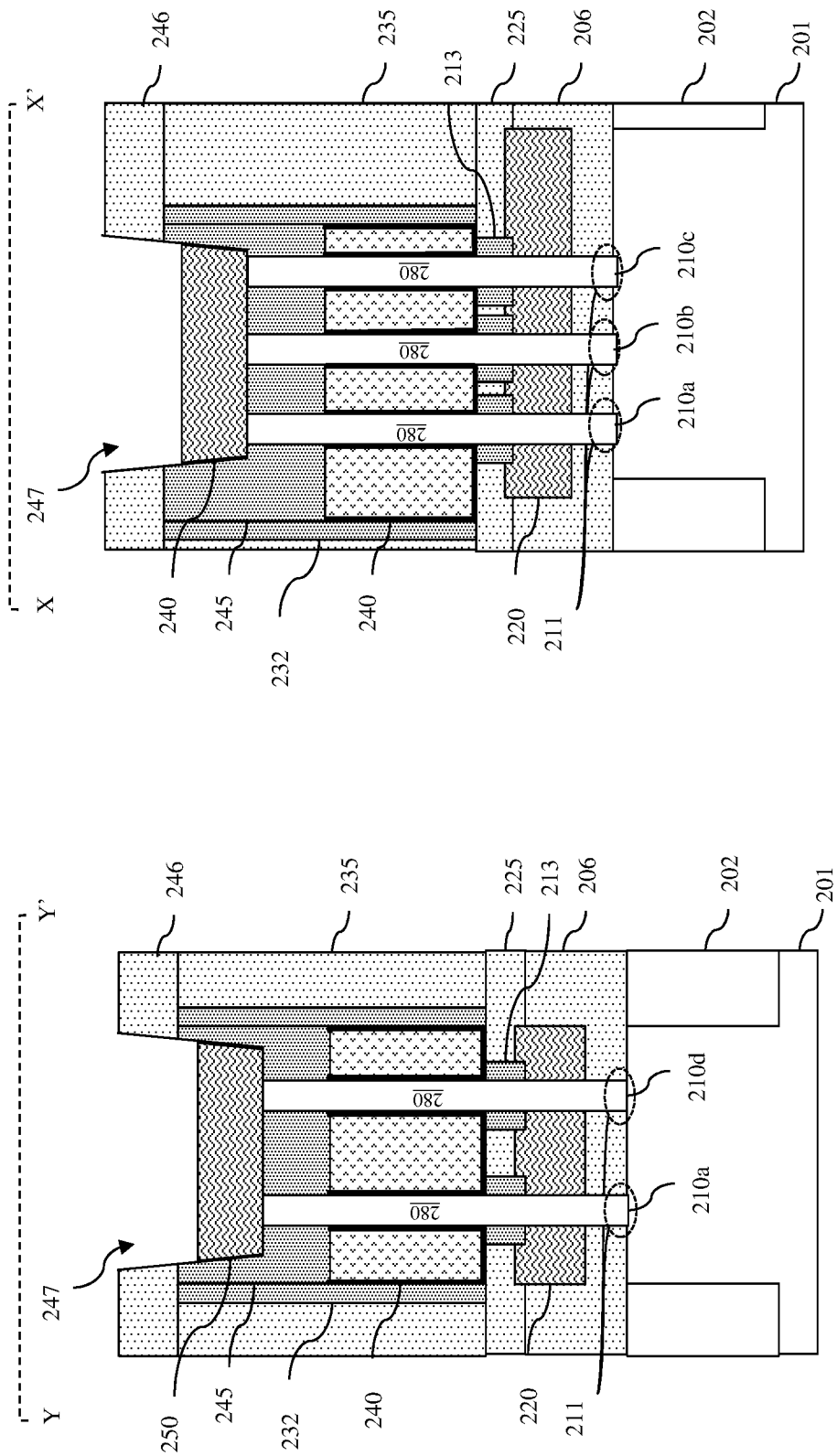
FIGS. 18A-18B are different cross-section diagrams illustrating a partially completed structure formed according to the flow diagram of FIG. 1.

Once the second recess 247 is formed, a second source/drain region 250 can be formed within the second recess 247 (128, see FIGS. 18A-18B). For example, the same third semiconductor material as used for the first source/drain region 220 can be epitaxially deposited into the second recess 247 so as to be immediately adjacent to the exposed top surfaces and any vertical surfaces of the semiconductor pillars 210a-f exposed within the second recess 247. The epitaxial deposition process can be performed so as to only partially fill the second recess 247. Alternatively, the epitaxial deposition process can be performed so as to overfill the second recess. Then, the third semiconductor material can be etched back so that the resulting second source/drain region 250 has a desired thickness and only partially fills the second recess 247. In any case, as with the first source/drain region 220, in situ doping can be performed during the epitaxial deposition process in order to achieve a desired conductivity type and level. For example, for an NFET, the third semiconductor material can be in situ doped so as to have N-type conductivity at a relatively high conductivity level; whereas, for a PFET, the third semiconductor material can be in situ doped so as to have P-type conductivity at a relatively high conductivity level.

Figure 19B:
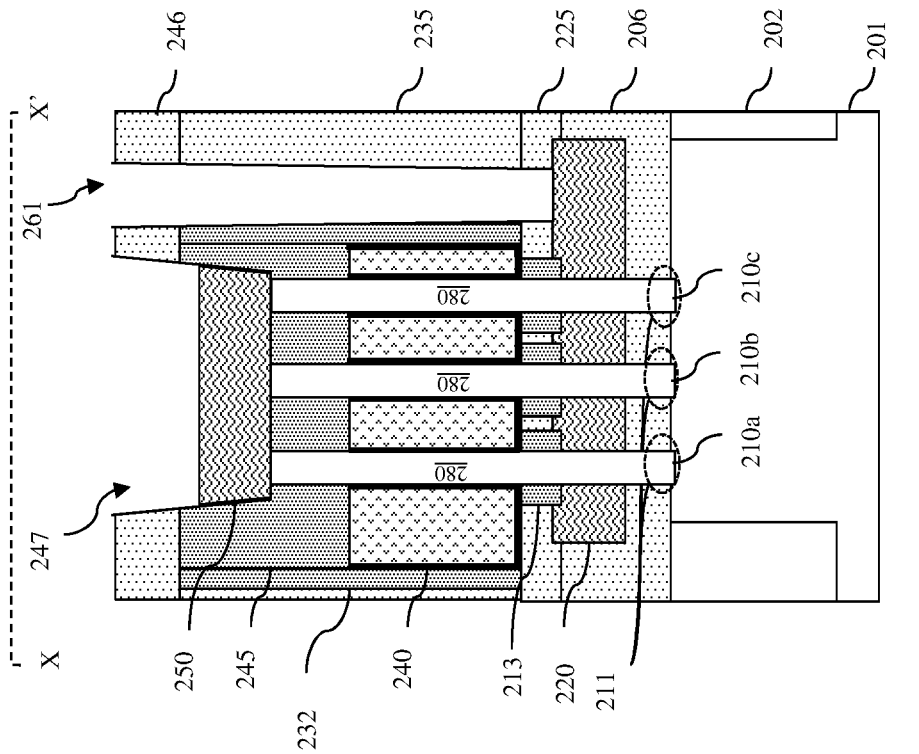
FIGS. 19A-19B are different cross-section diagrams illustrating a partially completed structure formed according to the flow diagram of FIG. 1.
Figure 19A:
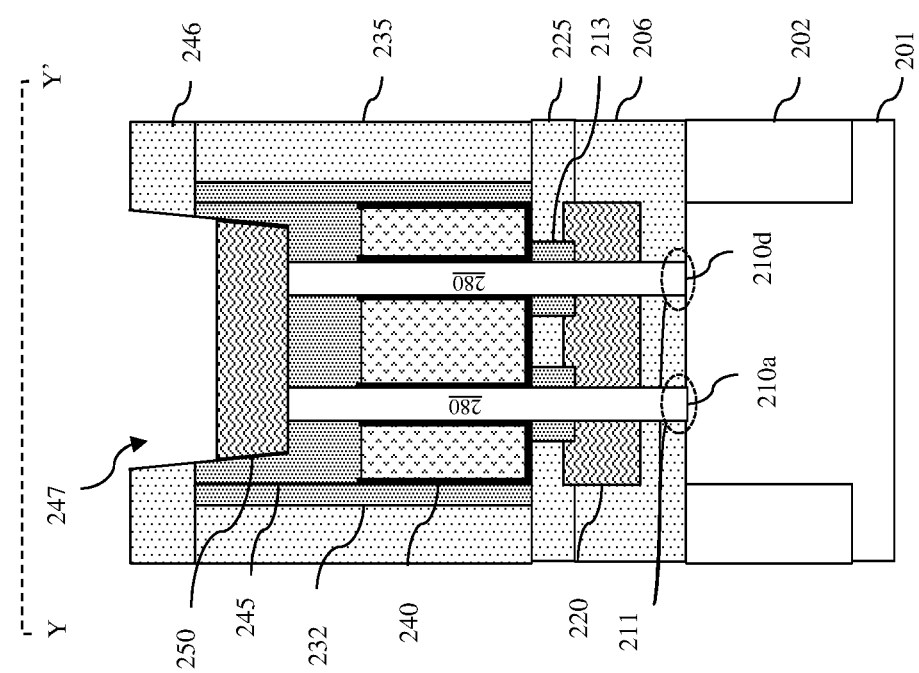
Figure 20B:
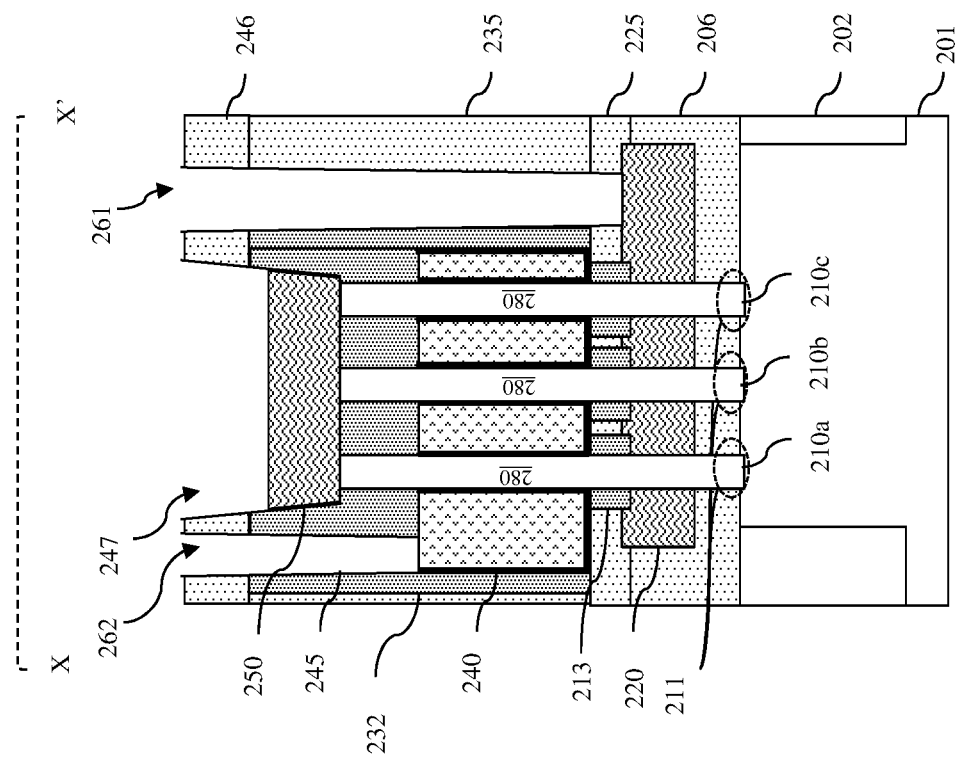
FIGS. 20A-20B are different cross-section diagrams illustrating a partially completed structure formed according to the flow diagram of FIG. 1.
Figure 20A:
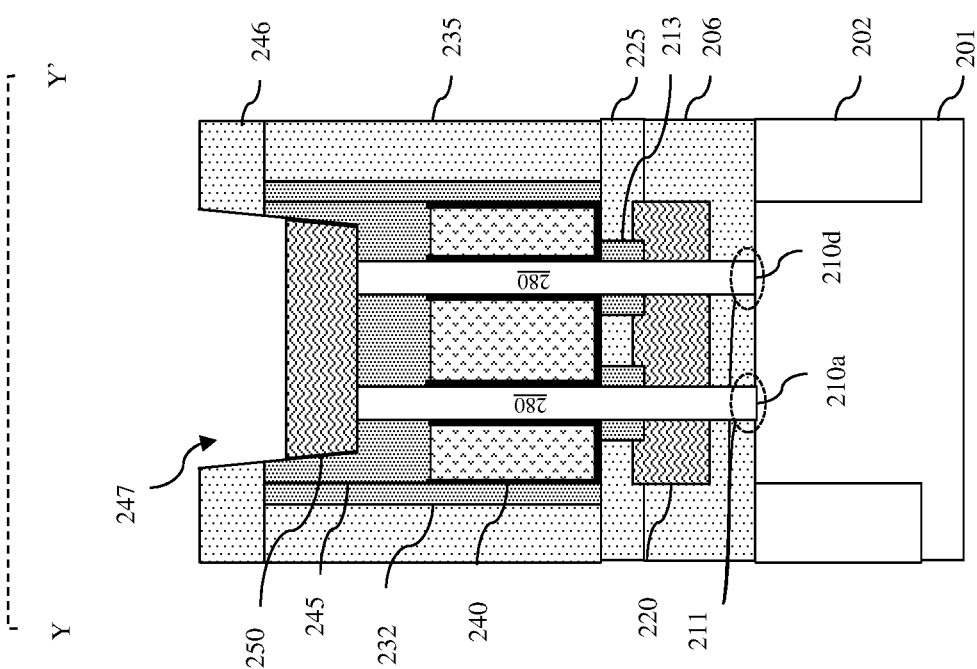
Figures 21A, 21B:
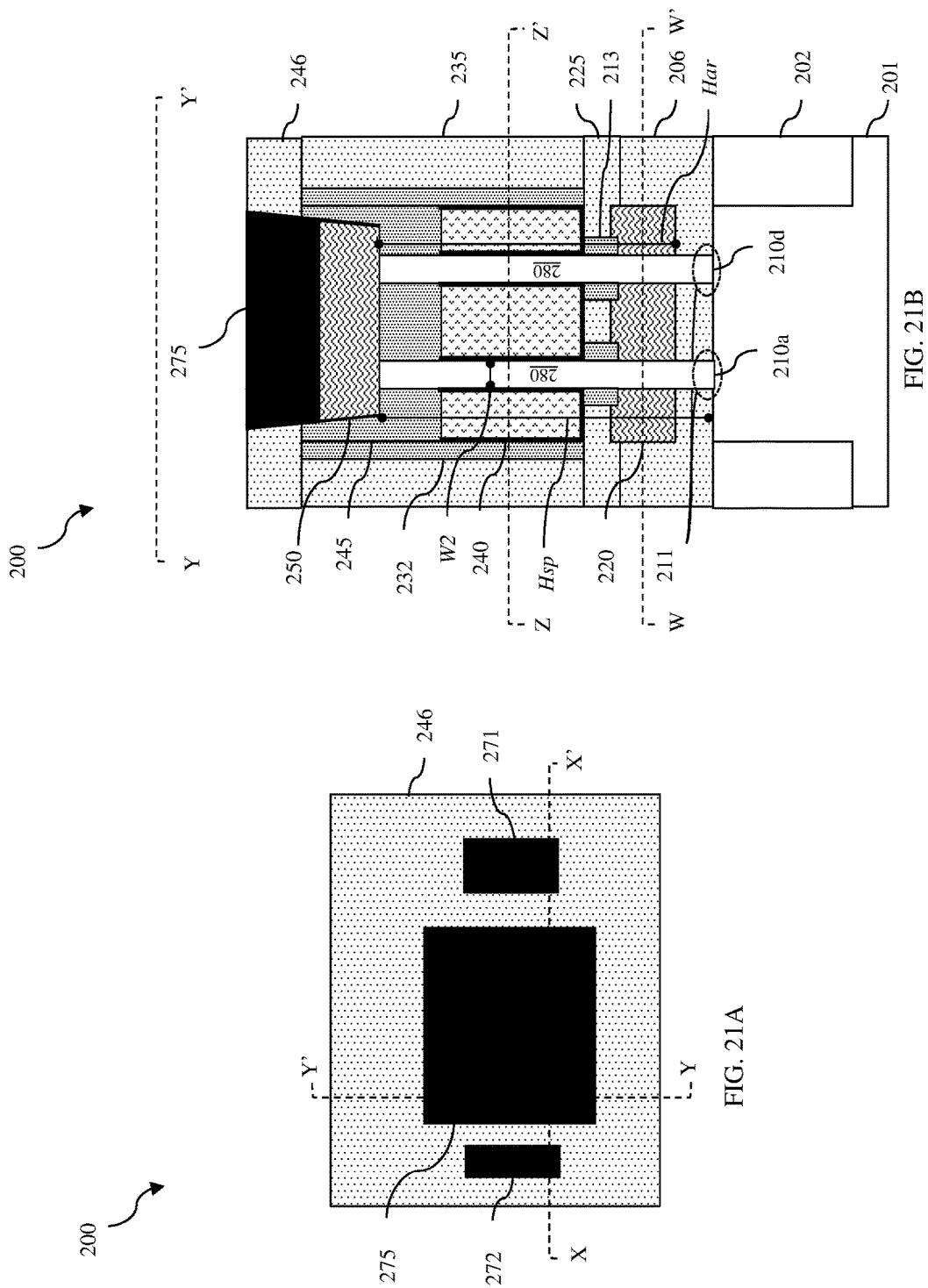
Figure 21C:
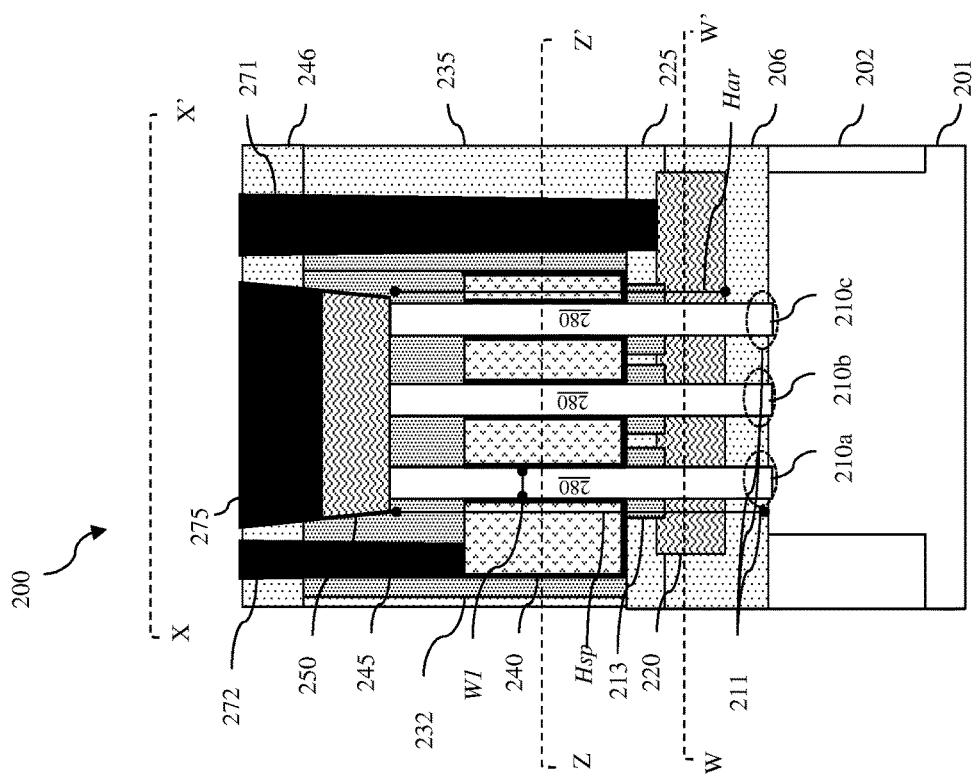

Additional processing can subsequently be performed to form middle of the line (MOL) contacts to the gate 240 and the source/drain regions 220 and 250 (130). Specifically, a first contact opening 261 can be formed (e.g., lithographically patterned and selectively etched) so as to extend vertically through the additional ILD layer 246, the ILD layer 235, and the second dielectric layer 225 to the outer edge portion of the first source/drain region 220 that extends laterally beyond the gate 240 (see FIGS. 19A-19B). A second contact opening 262 can be formed (e.g., lithographically patterned and selectively etched) so as to extend vertically through the additional ILD layer 246 and the gate cap 245 to the outer edge portion of the gate 240 that extends laterally beyond the second recess 247 (see FIGS. 20A-20B). It should be noted that the order in which these contact openings 261-262 can vary. That is, the first contact opening 261 can be patterned and etched followed by the second contact opening 262, as illustrated, or vice versa. In any case, after the contact openings 261-262 are formed, one or more layers can be deposited to form a source/drain contact 271 in the first contact opening 261, a gate contact 272 in the second contact opening 262 and a second source/drain contact 275 in an upper portion of the second recess 247 above the second source/drain region 250 (see FIGS. 21A-21E). For example, a liner that includes one or more barrier layers can be conformally deposited so as to line the first contact opening 261, the second contact opening 262 and the upper portion of the second recess 247 above the second source/drain region 250. The liner can include layers of titanium, titanium nitride or any other suitable barrier layer. A metal layer can then be deposited on the liner so as to fill the first contact opening 261, the second contact opening 262 and the upper portion of the second recess 247. The metal layer can be, for example, a tungsten layer, a cobalt layer, an aluminum layer, a copper layer or a layer of any other metal suitable for use in MOL contacts. A polishing process (e.g., a CMP process) can subsequently be performed so as to remove the contact materials from above the top surface of the additional ILD layer 246.

For purpose of illustration, the first source/drain contact 271 and the gate contact 272 are shown as being positioned on opposite sides of the second source/drain contact 275. However, it should be understood that the Figures are not intended to be limiting and that, alternatively, the first source/drain contact 271 and the gate contact 272 can be on the same side of the second source/drain contact 275 or on adjacent sides of the second source/drain contact 275 as long as the first recess 215 for the first source/drain region 220 and the gate 240 are patterned with outer edge portions that can accommodate such configurations.

Referring to FIGS. 21A-21E, also disclosed herein are embodiments of a vertical pillar-type field effect transistor (FET) structure 200.

The FET structure 200 can include a substrate 201. This substrate 201 can be, for example, a bulk silicon substrate or any other suitable bulk monocrystalline semiconductor substrate. Alternatively, the substrate 201 can be some other monocrystalline semiconductor layer (e.g., a silicon layer of a silicon-on-insulator (SOI) wafer). In any case, the substrate 201 can be made of a first semiconductor material and can have at least a monocrystalline surface 203 suitable for use as a seed layer for subsequent epitaxial deposition of monocrystalline semiconductor material. Shallow trench isolation (STI) regions 202 can be within the substrate 201 and can define a device region.

The FET structure 200 can further include one or more semiconductor pillars, each having a bottom surface immediately adjacent to the monocrystalline surface 203 of the substrate 201 and a top surface opposite the bottom surface.

The semiconductor pillar(s) can be made of a second semiconductor material that is different from the first semiconductor material of the substrate. This second semiconductor material can be preselected for use in the FET channel region and, specifically, based upon the conductivity type of the FET being formed in order to achieve optimal performance. For example, for an N-type field effect transistor (NFET), the second semiconductor material can be a III-V compound semiconductor materials (e.g., indium phosphide (InP), gallium arsenide (GaAs), etc.); whereas, for a P-type FET (PFET), the second semiconductor material can be germanium or silicon germanium with a high germanium percentage. Additionally, for an NFET, the second semiconductor material can be doped so as to have a P-type conductivity at a relatively low conductivity level; whereas, for a PFET, the second semiconductor material can be doped so as to have an N-type conductivity at a relatively low conductivity level. Alternatively, for either an NFET or a PFET, the second semiconductor material could be undoped.

Since, as discussed above with regard to the method, the semiconductor pillar(s) are made by epitaxial deposition onto a monocrystalline surface, they will be monocrystalline in structure. Additionally, as discussed in detail above with regard to the method and FIGS. 3A-3I, the semiconductor pillar(s) can be formed within opening(s) in a dielectric layer such that they have the same shape and pattern as the opening(s). Thus, the FET structure 200 can have a single semiconductor pillar (e.g., see FIG. 3A) or multiple semiconductor pillars (e.g., see FIG. 3B-3I). In the case of multiple semiconductor pillars, these semiconductor pillars can, for example, be arranged in a line (e.g., see FIG. 3B), arranged in a grid pattern of columns and rows (e.g., see FIG. 3C) or randomly arranged (e.g., see FIG. 3D). Additionally, the shape of the semiconductor pillars as viewed in a horizontal cross-section can be any patternable shape. For example, the shape of can be square (e.g., see FIG. 3-D), rectangular (e.g., see FIG. 3E), circular (e.g., see FIG. 3F), elliptical (e.g., see FIG. 3G), triangular (e.g., see FIG. 3H), or some other polygon shape (e.g., hexagonal, see FIG. 3I), etc.

For purposes of illustration, the FET structure 200 is described in greater detail below and illustrated in FIGS. 21A-21E with respect to an embodiment that incorporates multiple semiconductor pillars 210a-f arranged in a grid pattern and each having an essentially square shape. It should be understood that the Figures and the description thereof are not intended to be limiting and that other embodiments of the FET structure 200 could include any number of one or more semiconductor pillars having any of the shapes mentioned above or any other suitable pillar shape.

In any case, the semiconductor pillars 210a-f can each have high aspect ratios (i.e., height to width ratios) in two directions. Specifically, each semiconductor pillar can have a height Hsp, a first width W1 in a first direction (e.g., the X-direction, as shown), and a second width W2 in a second direction (e.g., the Y-direction, as shown) that is essentially perpendicular to the first direction. Each semiconductor pillar 210a-f can have a first aspect ratio in the first direction (defined as the ratio of the height Hsp to the first width W1) and a second aspect ratio in the second direction (defined as the ratio of the height Hsp to the second width W2) and both of these aspect ratios can be relatively high. For example, both the first aspect ratio and the second aspect ratio of each opening can be at least greater than 5 and preferably between 10 and 100. It should be noted that the first aspect ratio and the second aspect ratio of each semiconductor pillar can be approximately equal. Alternatively, the two aspect ratios of each semiconductor pillar can be different (as long as they both are high, as discussed above). As discussed above with regard to the method, these aspect ratios should be predetermined to so as to provide for bi-directional aspect ratio trapping (ART) and, thereby ensure that any defects that occur during epitaxial deposition are trapped within the lower portions 211 of the semiconductor pillars 210a-f.

The FET structure 200 can further have a first dielectric layer 206 above and immediately adjacent to the top surface of the substrate 201. The first dielectric layer 206 can laterally surround the lower portions 211 of the semiconductor pillars 210a-f, which as mentioned above may have trapped therein any defects created during epitaxial deposition.

The FET structure 200 can further have various other components above the first dielectric layer and also laterally surrounding the semiconductor pillars 210a-f.

Specifically, the FET structure 200 can further have a first source/drain region 220 within a first recess 215 in the first dielectric layer 206. The first recess 215 containing the first source/drain region 220 can be positioned above the level of the lower portions 211 of the semiconductor pillars 210a-f. The first source/drain region 220 can be made of an third semiconductor material, which was epitaxially deposited into the first recess 215 so as to be immediately adjacent to exposed vertical surfaces of the semiconductor pillars 210a-f. The third semiconductor material can be the same semiconductor material as the first semiconductor material of the substrate 201 (e.g., silicon), the same semiconductor material as the second semiconductor material of the semiconductor pillars 210a-f, or some other suitable semiconductor material depending upon the conductivity type of the FET being formed. The third semiconductor material can be doped so that the first source/drain region 220 has a desired conductivity type and level given the conductivity type of the FET being formed. For example, for an NFET, the third semiconductor material can be doped so that the first source/drain region 220 has an N-type conductivity at a relatively high conductivity level. For a PFET, the third semiconductor material can be doped so that the first source/drain region 220 has a P-type conductivity at a relatively high conductivity level.

The FET structure 200 can further have a second dielectric layer 225 above and immediately adjacent to the first source/drain region 220, laterally surrounding the semiconductor pillars 210a-f and physically separated therefrom by remaining portions dielectric spacers 213 used during processing. The second dielectric layer 225 can be made of the same first dielectric material as the first dielectric layer 206. That is, the second dielectric layer 225 can be made of silicon oxide or some other suitable dielectric material that is different than the second dielectric material of the dielectric caps 212a-f and dielectric spacers 213.

The FET structure 200 can further have a gate 240 above and immediately adjacent to the second dielectric layer 225 and laterally surrounding channel regions 280 within each of the semiconductor pillars 210a-f. The gate can have a gate dielectric layer immediately adjacent to and laterally surrounding vertical surfaces of the semiconductor pillars 210a-f at the channel regions and a gate conductor layer on the gate dielectric layer such that the gate conductor layer also laterally surrounds the semiconductor pillars 210a-f and is physically separated therefrom by the gate dielectric layer (i.e., such that the gate dielectric layer is positioned laterally between the gate conductor layer and vertical surfaces of the semiconductor pillars at the channel regions, respectively). As discussed in detail above with regard to the method, the gate 240 can be a conventional gate-first gate structure or a replacement metal gate structure. It should be noted that this gate structure should be patterned during processing such that at least one outer edge portion of the first source/drain region 220 extends laterally beyond the gate 240. This outer edge portion of the first source/drain region 220 can subsequently be contacted, as discussed in greater detail below.

The FET structure 200 can further have a gate cap 245 above and immediately adjacent to the top of the gate 240. The gate cap 245 can laterally surround end portions of the semiconductor pillars 210a-f that extend above the level of the top of the gate 240 and partially into the gate cap 245. The gate cap 245 can be made of a second dielectric material that is different than the first dielectric material used for the first dielectric layer 206 and the second dielectric layer 225. The second dielectric material can be, for example, silicon nitride or some other suitable dielectric material that is different from the first dielectric material.

The FET structure 200 can further have gate sidewall spacer 232 on opposing sides of the gate 240 and gate cap 245. The gate sidewall spacer can be made of the same second dielectric material as the gate cap 245. Thus, for example, the gate sidewall spacer 232 can be made of silicon nitride or some other suitable dielectric material that is different from the first dielectric material.

The FET structure 200 can further a second source/drain region 250 within a second recess 247 in the gate cap 245. The second recess 247 containing the second source/drain region 250 can extend into the gate cap 245 so as to expose at least the top surfaces of the semiconductor pillars 210a-f without exposing the top of the gate 240 (i.e., so that the bottom of the second recess 247 is above and physically separated from the top of the gate 240). The second source/drain region 250 can be made of the same third semiconductor material as used for the first source/drain region 220. In this case, as discussed above with regard to the method, the third semiconductor material can be epitaxially deposited into the second recess 247 so as to be immediately adjacent to the exposed top surfaces and any vertical surfaces of the semiconductor pillars 210a-f exposed within the second recess 247. The second source/drain region 250 can only partially fill the second recess 247. Additionally, as with the first source/drain region 220, for an NFET, the third semiconductor material can be doped so as to have N-type conductivity at a relatively high conductivity level; whereas, for a PFET, the third semiconductor material can be doped so as to have P-type conductivity at a relatively high conductivity level.

The FET structure 200 can further have an interlayer dielectric (ILD) layer 235. This ILD layer 235 can be above and immediately adjacent to the second dielectric layer 225, can laterally surround the gate 240 and can be physically separated from the gate 240 by the gate sidewall spacer 232. The ILD layer 235 can be made of the same first dielectric material as the first and second dielectric layers or made of some other suitable ILD material. The top surface of the ILD layer 235 can be approximately level with the top surface of the gate cap 245.

The FET structure 200 can further have an additional ILD layer 246, which is above and immediately adjacent to the ILD layer 235 and which further extends laterally over the gate sidewall spacer 232 and gate cap 245. The ILD layer 235 can be made of the same dielectric materials as the ILD layer or some other suitable ILD material.

The FET structure 200 can further have middle of the line (MOL) contacts to the gate 240 and the source/drain regions 220 and 250. Specifically, a first contact 271 (i.e., a first source/drain contact) can extend vertically through the additional ILD layer 246, the ILD layer 235, and the second dielectric layer 225 to the outer edge portion of the first source/drain region 220 that extends laterally beyond the gate 240. A second contact 272 (i.e., a gate contact) can extend vertically through the additional ILD layer 246 and the gate cap 245 to the outer edge portion of the gate 240 that extends laterally beyond the second recess 247. An additional contact 275 (i.e., a second source/drain contact) can be above and immediately adjacent to the second source/drain region 250 and can fill the upper portion of the second recess in the gate cap 245. For purpose of illustration, the first source/drain contact 271 and the gate contact 272 are shown as being positioned on opposite sides of the second source/drain contact 275. However, it should be understood that the Figures are not intended to be limiting and that, alternatively, the first source/drain contact 271 and the gate contact 272 can be on the same side of the second source/drain contact 275 or on adjacent sides of the second source/drain contact 275 as long as the first recess 215 for the first source/drain region 220 and the gate 240 are patterned with outer edge portions that can accommodate such configurations.

In the above-described FET structure 200, any defects that have occurred during epitaxial deposition of the semiconductor pillars during processing will be trapped in the lower portions 211 of those pillars due to the bi-directional high aspect ratios of the semiconductor pillars. Since such defects are trapped such that they are not able to propagate throughout the semiconductor pillars and since the active components of the FET (including the first source/drain region 220, the channel region 280 and the second source/drain region 250) are all above the lower portions 211 such defects will not negatively impact device performance.

As mentioned above, the Figures and the description thereof are not intended to be limiting and other embodiments of the method and FET structure could include any number of one or more semiconductor pillars having any of the shapes mentioned above or any other suitable pillar shape. Since each semiconductor pillar includes a channel region 280 that extends between a lower first source/drain region 220 and an upper second source/drain region 250, it should be understood that the number of semiconductor pillars and the dimensions of the semiconductor pillar(s) and gate can be selectively adjusted during design in order to adjust the drive current of the vertical pillar-type FET 200.

In the embodiments of the method and FET structure described above, the vertical pillar-type FET can be an N-type FET or a P-type FET. For an N-type FET, the first type conductivity of the channel region within each semiconductor pillar can be a P-type conductivity and the second type conductivity of the source/drain regions can be an N-type conductivity; whereas, for a P-type FET, the first type conductivity of the channel region 280 within each semiconductor pillar can be an N-type conductivity and the second type conductivity of the source/drain regions can be a P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Additionally, those skilled in the art will recognize that the materials of the dielectric and metal layers used for a replacement metal gate can be preselected to achieve desired work functions given the conductivity type of the FET. Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal work function for a gate conductor of an N-type FET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal work function for a gate conductor of a P-type FET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten and aluminum.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). As used herein, the phrase "positioned laterally" refers to an element be positioned to one side of another element as opposed to above or below the other element as they are oriented in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming at least one semiconductor pillar that extends vertically through a first dielectric layer to a substrate;
   etching back the first dielectric layer;
   forming, above the first dielectric layer and laterally surrounding the semiconductor pillar, a first source/drain region immediately adjacent to the first dielectric layer, a second dielectric layer on the first source/drain region, a gate on the second dielectric layer and a gate cap on the gate, the gate cap further extending over a top surface of the semiconductor pillar;
   forming a recess in the gate cap to expose at least the top surface of the semiconductor pillar, a bottom of the recess being above and physically separated from a top of the gate; and
   forming a second source/drain region within the recess.

2. The method of claim 1, the semiconductor pillar having a first aspect ratio defined as a ratio of a height of the semiconductor pillar to a first width of the semiconductor pillar in a first direction and further having a second aspect ratio defined as a ratio of the height of the semiconductor pillar to a second width of the semiconductor pillar in a second direction that is perpendicular to the first direction, the first aspect ratio and the second aspect ratio being each greater than 5.

3. The method of claim 2,
   the semiconductor pillar being formed by epitaxial deposition,
   the first aspect ratio and the second aspect ratio causing substantial defects occurring during the epitaxial deposition of the semiconductor pillar to be trapped within a lower portion of the semiconductor pillar, and
   the first source/drain region being formed above and immediately adjacent to the first dielectric layer with the lower portion of the semiconductor pillar that contains the defects being below the first source/drain region and laterally surrounded by the first dielectric layer.

4. The method of claim 2, the first aspect ratio and the second aspect ratio being approximately equal and the semiconductor pillar being any of square and circular in shape.

5. The method of claim 2, the first aspect ratio and the second aspect ratio being different and the semiconductor pillar being any of rectangular, ovular and triangular in shape.

6. The method of claim 1, the substrate comprising a first semiconductor material and the semiconductor pillar comprising a second semiconductor material that is different from the first semiconductor material.

7. The method of claim 6, the first source/drain region and the second source/drain region comprising a third semiconductor material that is different from the second semiconductor material.

8. The method of claim 1,
   the first source/drain region having an outer edge portion that extends laterally beyond the gate,
   the second source/drain region only partially filling the recess, and the method further comprising:
   forming a first contact opening extending vertically to the outer edge portion of the first source/drain region;
   forming a second contact opening extending vertically to the gate; and
   depositing a metal layer to fill the first contact opening to form a first source/drain contact, to fill the recess to form a second source/drain contact and to fill the second contact opening to form a gate contact.

9. A method comprising:
   forming multiple openings that extend vertically through a first dielectric layer to a semiconductor substrate;
   forming semiconductor pillars in the openings such that the semiconductor pillars have bottom surfaces immediately adjacent to the semiconductor substrate and top surfaces opposite the bottom surfaces;
   forming dielectric caps within the openings on the top surfaces of the semiconductor pillars;
   etching back the first dielectric layer;
   forming dielectric spacers on the semiconductor pillars above the first dielectric layer;
   forming a first recess in the first dielectric layer below the dielectric spacers and around the semiconductor pillars, the recess leaving lower portions of the semiconductor pillars laterally surrounded by the first dielectric layer and vertical surfaces of the semiconductor pillars exposed between the first dielectric layer and the dielectric spacers;
   forming a first source/drain region within the first recess;
   forming a second dielectric layer on the first source/drain region;
   removing the dielectric caps and any dielectric material of the dielectric spacers above the second dielectric layer;
   forming a gate on the second dielectric layer, the gate laterally surrounding the semiconductor pillars and having a gate sidewall spacer;
   forming a gate cap on the gate, the gate cap laterally surrounding the semiconductor pillars and further being above and immediately adjacent to the top surfaces of the semiconductor pillars;
   forming a second recess in the gate cap to expose at least the top surfaces of the semiconductor pillars, a bottom of the second recess being above and physically separated from a top of the gate; and
   forming a second source/drain region within the second recess.

10. The method of claim 9,
    each semiconductor pillar having a first aspect ratio defined as a ratio of a height of the semiconductor pillar to a first width of the semiconductor pillar in a first direction and further having a second aspect ratio defined as a ratio of the height of the semiconductor pillar to a second width of the semiconductor pillar in a second direction that is perpendicular to the first direction,
    the first aspect ratio and the second aspect ratio being each greater than 5,
    the semiconductor pillars being formed by epitaxial deposition,
    the first aspect ratio and the second aspect ratio enabling substantial defects occurring during the epitaxial deposition of the semiconductor pillars to be trapped within the lower portions of the semiconductor pillars and
    the lower portions of the semiconductor pillars that contain the defects being below the first source/drain region and laterally surrounded by the first dielectric layer.

11. The method of claim 10, the first aspect ratio and the second aspect ratio being approximately equal and each semiconductor pillar being any of square and circular in shape.

12. The method of claim 10, the first aspect ratio and the second aspect ratio being different and each semiconductor pillar being any of rectangular, ovular and triangular in shape.

13. The method of claim 9, the substrate comprising a first semiconductor material, the semiconductor pillars comprising a second semiconductor material that is different from the first semiconductor material, and the first source/drain region and the second source/drain region comprising a third semiconductor material that is different from second semiconductor material.

14. The method of claim 9,
the first source/drain region having an outer edge portion that extends laterally beyond the gate,
the second source/drain region only partially filling the second recess, and
the method further comprising:
   forming a first contact opening extending vertically to the outer edge portion of the first source/drain region;
   forming a second contact opening extending vertically to the gate; and
   depositing a metal layer to fill the first contact opening to form a first source/drain contact, to fill the second recess to form a second source/drain contact and to fill the second contact opening to form a gate contact.

* * * * *